United States Patent
Bamji et al.

(10) Patent No.: US 10,389,957 B2
(45) Date of Patent: Aug. 20, 2019

(54) READOUT VOLTAGE UNCERTAINTY COMPENSATION IN TIME-OF-FLIGHT IMAGING PIXELS

(71) Applicant: Microsoft Technology Licensing, LLC, Redmond, WA (US)

(72) Inventors: Cyrus Soli Bamji, Fremont, CA (US); Onur Can Akkaya, Palo Alto, CA (US); Tamer Elkhatib, San Jose, CA (US); Swati Mehta, San Mateo, CA (US); Satyadev H. Nagaraja, San Jose, CA (US); Vijay Rajasekaran, Saratoga, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 253 days.

(21) Appl. No.: 15/385,198

(22) Filed: Dec. 20, 2016

(65) Prior Publication Data

US 2018/0176492 A1    Jun. 21, 2018

(51) Int. Cl.
*H04N 5/363* (2011.01)
*G01S 17/89* (2006.01)
(Continued)

(52) U.S. Cl.
CPC ............. *H04N 5/363* (2013.01); *G01S 7/481* (2013.01); *G01S 17/89* (2013.01); *H01L 27/14601* (2013.01)

(58) Field of Classification Search
CPC ........ G01S 17/89; G01S 7/4863; G01S 17/36; H04N 13/257; H04N 13/207; H04N 5/378;
(Continued)

(56) References Cited

U.S. PATENT DOCUMENTS 6,101,232 A * 8/2000 Fossum .............. G11C 19/282
377/60
6,184,055 B1  2/2001 Yang et al.
(Continued)

FOREIGN PATENT DOCUMENTS

EP    0757476 A2    2/1997
EP    1917800 A1    5/2008
(Continued)

OTHER PUBLICATIONS

"International Search Report and Written Opinion Issued in PCT Application No. PCT/US17/065935", dated Apr. 5, 2018, 13 Pages.
(Continued)

*Primary Examiner* — Roberto Velez
*Assistant Examiner* — Tuan H Le

(57) ABSTRACT

Pixel arrangements in time-of-flight sensors are presented that include sensing elements that establish charges related to incident light, charge storage elements that accumulate integrated charges transferred from the sensing elements, and diffusion nodes configured to establish measurement voltages representative of the integrated charges that are dumped from the charge storage elements. The pixel arrangement includes analog domain output circuitry comprising a measurement capacitance element that stores the measurement voltage, and a reset capacitance element that stores a reset voltage established at the diffusion node during a reset phase performed prior to a measurement phase. The analog domain output circuitry subtracts the stored reset voltage from the stored measurement voltage for processing into a pixel output voltage that at least partially reduces readout voltage uncertainty of the pixel arrangement.

20 Claims, 8 Drawing Sheets

(51) Int. Cl.
*G01S 7/481* (2006.01)
*H01L 27/146* (2006.01)

(58) Field of Classification Search
CPC .... H04N 5/3698; H04N 5/332; H04N 5/2256; H04N 9/045; H04N 5/37457; H01L 27/14649; H01L 27/1464; H01L 27/14621; H01L 27/14641
See application file for complete search history.

(56) References Cited

U.S. PATENT DOCUMENTS

| | | | |
|---|---|---|---|
| 6,222,175 | B1 | 4/2001 | Krymski |
| 6,483,129 | B2 | 11/2002 | Rhodes et al. |
| 6,727,486 | B2 | 4/2004 | Choi |
| 6,756,616 | B2 | 6/2004 | Rhodes |
| 7,321,111 | B2 | 1/2008 | Bamji et al. |
| 7,352,454 | B2 | 4/2008 | Bamji et al. |
| 7,524,717 | B2 | 4/2009 | Park et al. |
| 7,675,561 | B2 | 3/2010 | Lepage |
| 7,705,900 | B2 | 4/2010 | Guidash |
| 7,843,029 | B2* | 11/2010 | Kawahito ............. G01C 3/02 257/431 |
| 8,471,938 | B2 | 6/2013 | Altice et al. |
| 8,637,800 | B2 | 1/2014 | Kozlowski |
| 9,052,382 | B2 | 6/2015 | Bamji et al. |
| 9,287,304 | B2 | 3/2016 | Park et al. |
| 2004/0251482 | A1 | 12/2004 | Rhodes |
| 2006/0027730 | A1* | 2/2006 | Bamji ................ G01S 7/487 250/208.1 |
| 2007/0158770 | A1* | 7/2007 | Kawahito ............ G01S 7/4816 257/431 |
| 2008/0079833 | A1* | 4/2008 | Ichikawa ............ G01S 7/4816 348/311 |
| 2010/0188491 | A1 | 7/2010 | Shizukuishi |
| 2011/0037969 | A1* | 2/2011 | Spickermann ........ G01S 7/4863 356/5.01 |
| 2012/0205723 | A1* | 8/2012 | Suzuki ................. G01S 17/89 257/215 |
| 2013/0020463 | A1 | 1/2013 | Lee et al. |
| 2013/0181119 | A1* | 7/2013 | Bikumandla ..... H01L 27/14612 250/214.1 |
| 2013/0292548 | A1 | 11/2013 | Agranov et al. |
| 2014/0077062 | A1 | 3/2014 | Hynecek |
| 2014/0198183 | A1 | 7/2014 | Kim et al. |
| 2014/0300700 | A1 | 10/2014 | Bamji et al. |
| 2014/0375979 | A1 | 12/2014 | Oh et al. |
| 2016/0150175 | A1 | 5/2016 | Hynecek |
| 2016/0165160 | A1* | 6/2016 | Hseih ................... H04N 5/363 348/308 |
| 2016/0225812 | A1 | 8/2016 | Elkhatib et al. |
| 2017/0338274 | A1 | 11/2017 | Gancarz et al. |
| 2019/0086519 | A1 | 3/2019 | Roy et al. |

FOREIGN PATENT DOCUMENTS

| | | |
|---|---|---|
| EP | 2148514 A1 | 1/2010 |
| EP | 2453649 A2 | 5/2012 |
| EP | 2541275 A1 | 3/2013 |
| WO | 2006012761 A1 | 2/2006 |

OTHER PUBLICATIONS

"International Search Report and Written Opinion Issued in PCT Application No. PCT/US2017/065936", dated Mar. 8, 2018, 15 Pages.

Kwon, et al., "A Fully-Differential Correlated Doubling Sampling Readout Circuit for Mutual-capacitance Touch Screens", In Journal of Semiconductor Technology and Science, vol. 15, No. 3, Jun. 2015, pp. 349-355.

Kim, et al., "A High Speed CMOS Image Sensor with a Novel Digital Correlated Double Sampling and a Differential Difference Amplifier", In Journal of Sensors, vol. 15, Issue 3, Mar. 2015, pp. 5081-5095.

Ramachandra Rao, Padmakumar., "Charge-Transfer CMOS Image Sensors: Device and Radiation Aspects", In Thesis of Delft University of Technology, May 18, 2009, 195 pages.

Heuberger, et al., "Microelectronic Systems: Circuits, Systems and Applications", In publication of springer, Jan. 1, 2011, 361 pages.

Stoppa, et al., "Time of Flight Image Sensors in 0.18μm CMOS Technology: a Comparative Overview of Different Approaches", In Proceedings of International Image Sensor Workshop, Jun. 2011, 4 pages.

Meynants, Guy, "Global shutter image sensors", http://electroiq.com/blog/2014/09/global-shutter-image-sensors/, Published on: Sep. 2014, 10 pages.

U.S. Appl. No. 14/788,224, Bamji, et al., "An Enhanced Modulation Contrast CMOS Three-Dimensional Image Sensor Detectors Which is Robust for Interfacial Traps Charges and Other Fabrication Induced Fixed Changes", Filed Date: Jun. 30, 2015.

Stefan Lauxtermann et al. "Comparison of global shutter pixels for CMOS image sensors," in proc. of international image sensor workshop, Jun. 2007, pp. 82-85.

Ge, Xiaoliang, "The Design of a Global Shutter CMOS Image Sensor in 110nm Technology", In Master Thesis of Delft University of Technology, Aug. 21, 2012, pages.

"Archive for Feb. 2012", In Journal of IEEE International Solid-State Circuits Conference, Feb. 28, 2012, 8 pages.

Krymski, Alex, "Global Shutter Pixel with Floating Storage Gate", In Proceedings of IEEE International Image Sensor Workshop, Jun. 2013, 4 pages.

Stefanov, et al., "A Global Shutter CMOS Image Sensor for Hyperspectral Imaging", In Proceedings of SPIE, Society of Photo-Optical Instrumentation Engineers, Aug. 2015, 12 pages.

Wan, et al., "CMOS Image Sensors with Multi-Bucket Pixels for Computational Photography", In Journal of IEEE Journal of Solid-State Circuits, vol. 47, No. 4, Apr. 2012, pp. 1031-1042.

Tadmor, et al., "A High QE, Fast Shuttered CMOS Image Sensor with a Vertical Overflow Drain Shutter Mechanism", In Proceedings of International Image Sensor Workshop, Jun. 8, 2015, 4 pages.

"Non Final Office Action Issued in U.S. Appl. No. 15/385,373", dated May 15, 2019, 8 Pages.

* cited by examiner

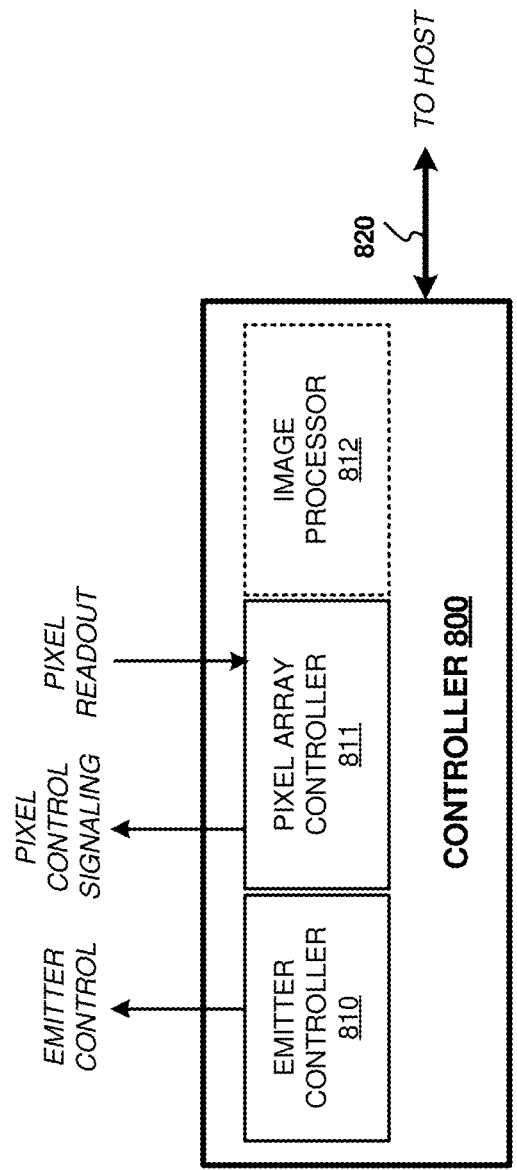

READOUT VOLTAGE UNCERTAINTY COMPENSATION IN TIME-OF-FLIGHT IMAGING PIXELS

BACKGROUND

Digital imaging sensors are employed in many devices and systems to capture images, such as in digital cameras. Imaging sensors employ large semiconductor arrays of detection pixels that can comprise charge-coupled devices (CCDs) or complementary metal oxide semiconductor (CMOS) devices, among others. The imaging sensors can be configured to capture a range of the electromagnetic spectrum that spans both visible light and infrared light ranges.

Specialized imaging sensors can be employed in time-of-flight (ToF or TOF) camera systems. ToF sensing devices share some aspects of visible wavelength sensors, such as RGB imaging sensors, but also have some unique characteristics. ToF cameras measure a three dimensional representation of a scene using emission of light that is precisely timed to measurement or detection by an imaging sensor. Some ToF systems use a differential pixel structure within an integrated array of pixels that can detect incident light during associated detection phases. These ToF cameras can be employed in applications where identifying relative depths among objects in a scene is useful, such as interactive gaming devices, virtual reality devices, augmented reality devices, industrial controls, medical scanners, or other devices.

Overview

Pixel arrangements in time-of-flight sensors are presented that include sensing elements that establish charges related to incident light, charge storage elements that accumulate integrated charges transferred from the sensing elements, and diffusion nodes configured to establish measurement voltages representative of the integrated charges that are dumped from the charge storage elements. The pixel arrangement includes analog domain output circuitry comprising a measurement capacitance element that stores the measurement voltage, and a reset capacitance element that stores a reset voltage established at the diffusion node during a reset phase performed prior to a measurement phase. The analog domain output circuitry subtracts the stored reset voltage from the stored measurement voltage for processing into a pixel output voltage that at least partially reduces readout voltage uncertainty (such as kTC noise) of the pixel arrangement.

This Overview is provided to introduce a selection of concepts in a simplified form that are further described below in the Detailed Description. It may be understood that this Overview is not intended to identify key features or essential features of the claimed subject matter, nor is it intended to be used to limit the scope of the claimed subject matter.

BRIEF DESCRIPTION OF THE DRAWINGS

Many aspects of the disclosure can be better understood with reference to the following drawings. While several implementations are described in connection with these drawings, the disclosure is not limited to the implementations disclosed herein. On the contrary, the intent is to cover all alternatives, modifications, and equivalents.

FIG. 8 illustrates an example controller suitable for implementing any of the architectures, processes, methods, and operational scenarios disclosed herein.

DETAILED DESCRIPTION

Figure 1:
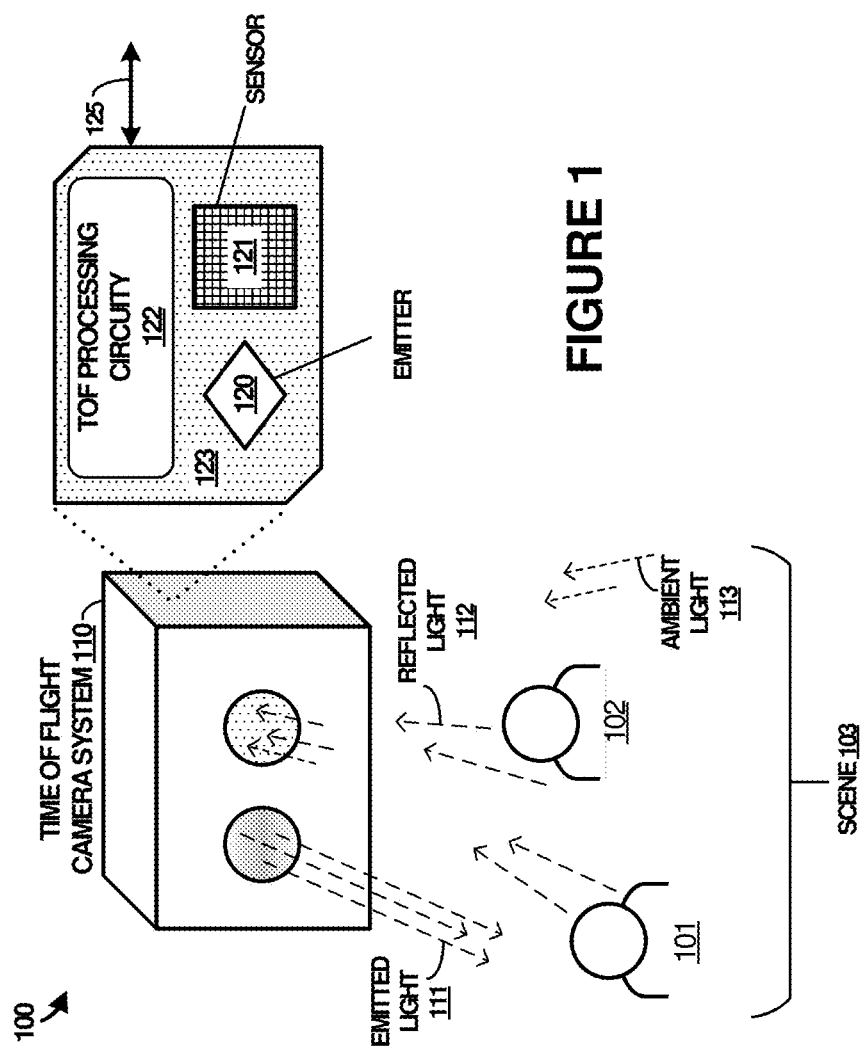
FIG. 1 illustrates a time of flight camera environment in an implementation.

Imaging sensors, such as visible red-green-blue (RGB) wavelength imaging sensors, two-dimensional (2D) imaging sensors, and time-of-flight (ToF) based three-dimensional (3D) imaging sensors, have found several applications in consumer products, industrial automation, medical imaging, automotive driving assistance, scientific imaging, virtual reality systems, augmented reality systems, as well as gaming consoles and other related areas. For example, ToF sensors can deliver 3D images by using precisely timed active illumination for measurement, as well as specialized differential pixel structures. Although ToF imaging systems can employ various wavelengths of light, in many of the examples herein infrared (IR) light will be discussed. It should be understood that other wavelengths of light can be employed.

Demand for high resolution (i.e. more pixels per unit area) image sensors and ToF sensors are increasing due to emerging products such as motion sensing input devices, augmented reality devices, and virtual reality devices. In addition to resolution concerns, sizes of associated imaging sensors have also decreased to reduce physical packaging constraints and reduce power consumption. As imaging sensors of various types are decreased in size, these size reductions are sometimes achieved by lower feature size of the individual structures formed onto the semiconductor substrates. However, feature size reduction can hit limitations due to increases in noise in the sensing structures used to sense light, especially in differential structures used in ToF sensors.

When a pixel of an imaging sensor is reset there can be an uncertainty in the final reset voltage of the pixel. The voltage uncertainty to which the pixel is reset prior to an integration stage can be shown to be $$\text{uncertainty} = \sqrt{\frac{kT}{C}},$$

where C is the readout capacitance of the pixel, k is the Boltzmann constant, and T is the absolute temperature of the imaging sensor measured in Kelvin. This uncertainty called "kTC noise" can give rise to noise in captured images because the final value read from the pixel is the sum of collected charge and the initial reset value. Also, the uncertainty grows as pixels shrink and C becomes smaller. Small pixel sizes can suffer from high kTC noise because of small associated readout capacitances.

To improve uncertainty caused by kTC noise, a reset voltage (V) of the pixel ($V_{reset}$) is measured after the pixel is reset. After an integration process that collects charge related to captured light, a value $V_{integration}$ is present on the pixel. The signal integrated by the pixel can be then determined by $V_{signal}=V_{integration}-V_{reset}$. In some examples, this operation reduces kTC noise in the digital domain by using extra ADC processes (for $V_{reset}$), and extra memory to store the digitized $V_{reset}$ value during the integration process. However, using the extra ADC processes can add complexity, subject the resultant pixel data to extra ADC or amplifier noise as well as to limitations in the dynamic range of any associated ADC circuit, in part because $V_{reset}$ can vary and consume differential dynamic range of associated circuitry. This process can be referred to as digital double correlated sampling (DDCS).

Pinned diode pixels are often used as photodetectors in non-ToF pixels. However, pinned diodes are not well suited in ToF pixels. However, various noise-reduction techniques can be applied to these non-ToF pixels. For example, a 4 T pixel structure can be employed in non-ToF imaging sensors to reduce ADC noise and avoid some ADC overheads. In the 4 T pixel, charges are stored in a pinned diode element which can be fully drained of charge. During integration processes, the pinned diode accumulates charges related to incident light. Pinned diode charges are then dumped into a floating diffusion for readout, even if a period of time has passed after the charge has accumulated in the pinned diode. After the integration process, this floating diffusion can be reset immediately before the charges from the pinned diode are dumped and the reset value $V_{reset}$ is sampled from the floating diffusion. After dumping the charges from the pinned diode, the floating diffusion voltage becomes $V_{integration}$. This $V_{integration}$ voltage can be subtracted from the immediately prior sampled $V_{reset}$ to yield $V_{signal}=V_{integration}-V_{reset}$. In a pixel without this feature, $V_{reset}$ is acquired before integration and must be stored digitally in a memory device or other digital storage element. However, in this case, $V_{integration}$ and $V_{reset}$ can be sampled after the integration process and in rapid succession so $V_{integration}$ and $V_{reset}$ can be subtracted in the analog domain and not need digital memory or an extra ADC conversion process. This process can be referred to as analog double correlated sampling (ADCS). Further improvements to the 4 T pixel can include adding a global reset to establish a 5 T Pixel. When the global reset feature is activated the pixel stops accumulating charge in response to incident light, and instead drains any associated charge to a voltage source. Additional features include global shutter features that allow capture of an entire frame of pixels, instead of a rolling or progressive shutter of other systems.

However, the DDCS pixels, the 4 T pixels with ADCS, or 5 T pixels which use pinned diodes cannot be readily used in many types of ToF systems. Pinned diodes are used as the photocharge collecting mechanism in non-ToF systems and can occupy substantially the whole pixel. However, pinned diodes are typically not suitable for the photocharge collecting mechanisms for ToF applications because pinned diodes cannot be readily modulated for charge collection efficiency in a differential manner. Also, pinned diodes are less than ideal in charge storage capability for ToF applications, due in part to the relatively larger sizes for a given capacitance and differential configuration of photodetection structures in ToF applications.

Small ToF pixels can suffer from high kTC noise due in part to small associated readout capacitances. Example kTC noise compensation techniques include 'differential' digital double correlated sampling DDDCS, which is an extension of DDCS. DDDCS uses a digital memory to store differentially-operated ToF pixels, such as the memory devices described above, to store $V_{reset}$ values until at least $V_{integration}$ signals are measured. However, a digital memory is undesirable due to increased circuitry, power consumption, and complexity to include sufficient digital memory for an entire imaging array.

Thus, the examples herein present enhanced technical effects in ToF pixels that reduce at least the kTC noise in differential ToF pixels. The examples herein provide differential analog double correlated sampling (DADCS) capability to a differential ToF pixel. These enhancements also reduce the number of ADC conversion processes required, the amount of digital memory required, as well as associated drawbacks with increased part count, part noises, power consumptions, and complexity, while still achieving a reduction in kTC noise. The examples herein perform differential ToF measurements and kTC noise reduction without the need for 2 ADC conversions during a readout of a differential ToF pixel, and without the need for a digital memory for subtraction logic by performing double correlated operations in the analog domain. This results in a number of technical effects and advantages, such as reduction in ADC power consumption, improvement in ADC throughput, improvement in ADC noise contributions, and elimination of differential offsets between differential sides of a pixel which can leverage dynamic ranges of associated circuitry without additional offset cancellation circuitry.

As a first example that can employ the enhanced pixel structures and ToF imaging sensors discussed herein, FIG. 1 is presented. FIG. 1 is a system diagram illustrating ToF camera environment 100. Environment 100 includes time of flight camera system 110 and scene elements 101-102. A detailed view of ToF camera system 110 is shown including emitter 120, ToF sensor 121, and ToF processing circuitry 122 mounted on one or more circuit boards 123. ToF camera system 110 communicates with external systems over communication link 125. In some examples, elements of emitter 120 and image processing circuitry are included in sensor 121.

In operation, ToF camera system 110 emits light 111 using emitter 120 to illuminate elements in scene 103, such as scene elements 101-102. Light 111 reflects off objects and elements in scene 103 and is received as reflected light 112 by sensor 121. Sensor 121 might be configured to detect objects and elements in the scene illuminated by reflected light 112, or instead detect objects and elements in the scene illuminated by ambient light 113. Sensor 121 can detect light using an array of pixels on a semiconductor substrate of sensor 121. Once the associated light is detected by sensor 121, pixel data representative of this detected light is provided to ToF processing circuitry 122 which processes the pixel data to determine one or more images, which might comprise a depth map of the scene resultant from illumination.

Referring back to the elements of FIG. 1, emitter 120 can comprise one or more light emitters, such as light-emitting diodes (LEDs), laser emitters, laser diode emitters, VCELs, or other components. Emitter 120 can also include various driver circuitry configured to provide power to emitter 120 and synchronize emission of light with timing signals provided by ToF processing circuitry 122.

Sensor 121 comprises an array of pixels formed on a semiconductor substrate, along with associated driver, power, and output circuitry. The individual pixels can incorporate techniques and semiconductor structures found in CCD pixels or CMOS pixels, among other semiconductor-based light detection techniques and elements. Further examples of sensor 121 will be discussed in FIGS. 3-7 herein.

Link 125 comprises one or more wired or wireless communication links for communicating with external systems, such as computing devices, microprocessors, servers, network devices, smartphone devices, or other processing systems. Link 125 can carry imaging data and related data, such determined by ToF camera system 110, or can carry commands and instructions transferred by an external control system. Link 125 can comprise a Universal Serial Bus (USB) interface, Peripheral Component Interconnect Express (PCIe) interface, wireless interface, IEEE 802.15 (Bluetooth) wireless link, IEEE 802.11 (WiFi) wireless link, Direct Media Interface (DMI), Ethernet interface, networking interface, serial interface, parallel data interface, or other communication or data interface, including combinations, variations, and improvements thereof.

Figure 2:
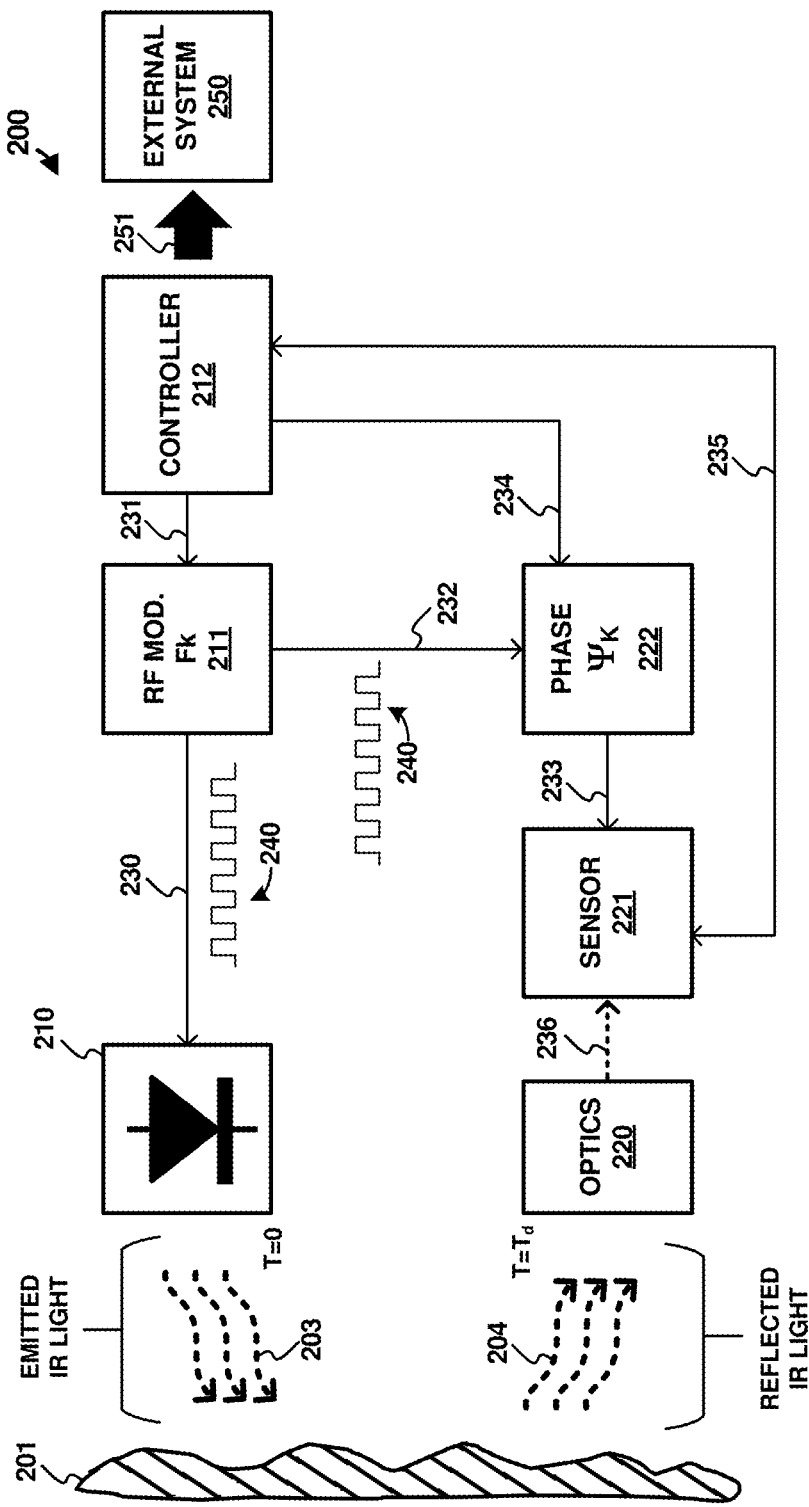
FIG. 2 illustrates a system diagram of a time of flight sensing system in an implementation.

To further illustrate the elements of FIG. 1 and provide a detailed view of one example ToF camera system, FIG. 2 is presented. FIG. 2 is a block diagram illustrating ToF sensing system 200. Elements of system 200 can be incorporated into elements of ToF camera system 110. FIG. 2 includes object of interest 201 within a scene which is imaged by system 200 to identify ToF information for at least object 201 and provide this information to external system 250 over communication link 251. The ToF information, such as a ToF signal, can comprise a signal proportional to a phase shift between emitted light pulses detected and a reference signal. The ToF signal can be used to determine distances to objects in a scene, such as object 201, from which emitted light was reflected. Although infrared light (IR) is discussed in FIG. 2, it should be understood that other suitable wavelengths of light can be employed.

System 200 includes IR emitter 210, radio frequency (RF) modulator 211, controller 212, optics 220, sensor 221, and phase module 222. RF modulator 211 comprises a system oscillator that generates RF modulation signal 240 and is controlled by controller 212 over link 231. RF modulation signal 240 is provided to IR emitter 210 over link 230 for emission as IR light 203. Emitted IR light 203 is modulated according to RF modulation signal 240 by IR emitter 210, and illuminates object 201.

Experiencing a time-of-flight time delay, the back scattered reflected IR light 203 is received by optics 220 and provided via optical path 236 onto sensor 221. Sensor 221 includes at least one pixel or one array of pixels. RF modulator 211 simultaneously transfers a reference signal as RF modulation signal 240 over link 232 to phase module 222. Phase module 222 is controlled by controller 212 over link 234. Phase module 222 demodulates pixel data received over 233 using RF modulation system 240 as a baseline for phase processing.

Turning to the elements of FIG. 2, IR emitter 210 can comprise a light-emitting diode, diode laser, or other IR light emitter which can be modulated according to RF modulation signal 240. RF modulator 211 comprises various circuitry to generate an RF modulated signal based on control instructions from controller 212. RF modulator 211 can include crystal oscillators, clock generation circuitry, phase-locked loop (PLL) circuitry, or other modulation circuitry. Phase module 222 comprises a phase comparator circuit which can produce phase shifts between RF modulation signal 240 and a signal sent over link 233 from sensor 221 for use in determining a time-of-flight (ToF) signal. In some examples, RF modulator 211 and phase module 222 are combined into a single circuit module. Sensor 221 comprises an IR light sensor used for determining ToF information of object 201. Sensor 221 includes elements discussed herein for the various pixel arrays and pixel architectures. Optics 220 can comprise optical interfacing elements that can pass and focus at least IR light. Optics 220 can include prisms, optical adhesives, lenses, mirrors, diffusers, optical fibers, and the like, to optically couple incident light onto sensor 221. Links 230-235 can each comprise wired or wireless links to interconnect the associated modules of FIG. 2. When combined onto one or more printed circuit boards, links 230-235 can comprise printed circuit traces.

Controller 212 can include communication interfaces, network interfaces, processing systems, computer systems, microprocessors, storage systems, storage media, or some other processing devices or software systems, and can be distributed among multiple devices. Examples of controller 212 can include software such as an operating system, logs, databases, utilities, drivers, caching software, networking software, and other software stored on non-transitory computer-readable media. A further example of controller 212 is shown in FIG. 8. External system 250 can comprise a network device, computing device, gaming platform, virtual reality system, augmented reality system, or other device, including combinations thereof. System 200 can also include power supply circuitry and equipment, enclosures, chassis elements, or ventilation/cooling systems, among other elements not shown in FIG. 2 for clarity.

Figure 3:
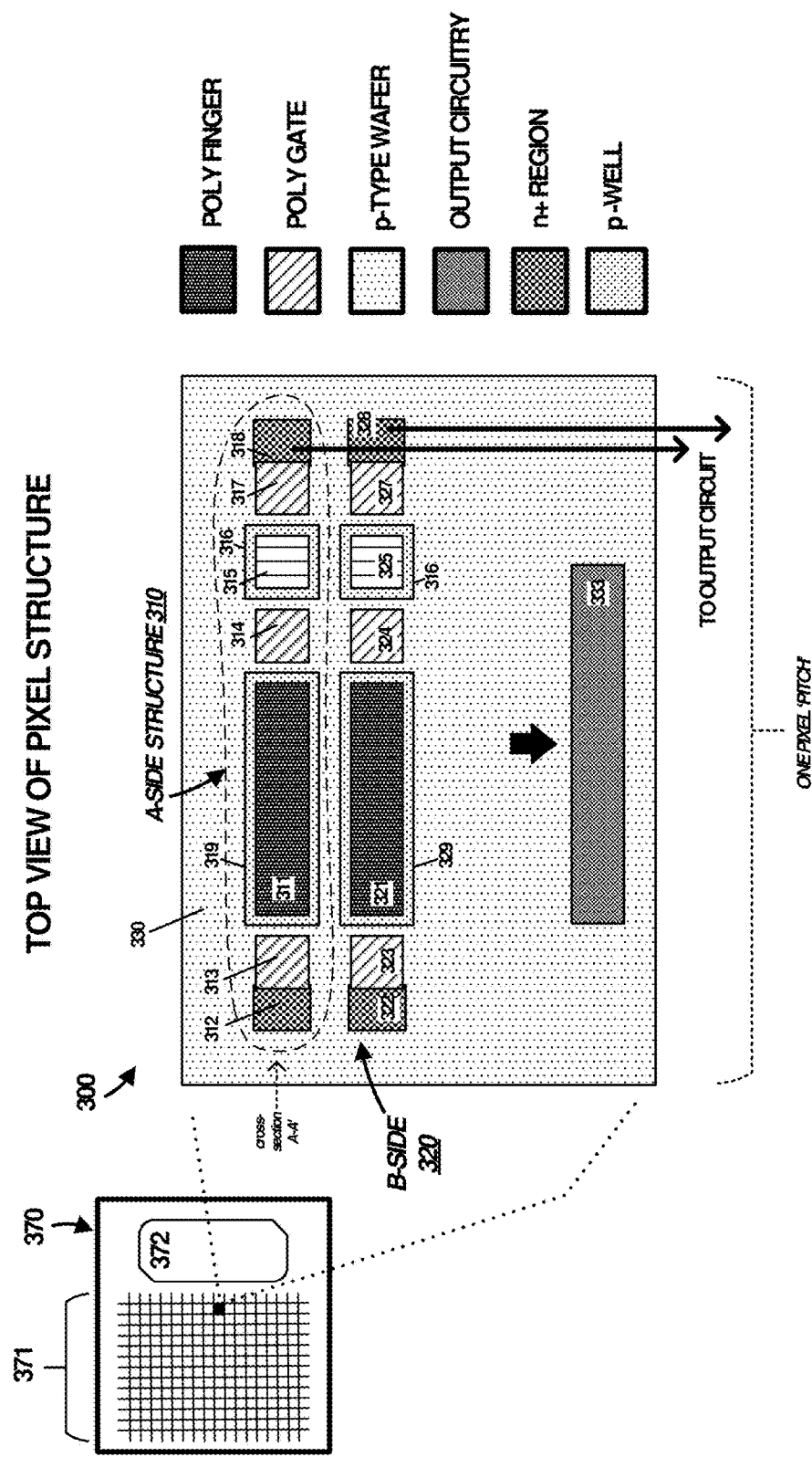
FIG. 3 illustrates a top view of a pixel structure in an implementation.

FIG. 3 illustrates a top view semiconductor topology for pixel structure 300. Pixel structure 300 illustrates one pixel 'pitch' which includes one differential ToF pixel structure. Pixel structure 300 comprises a pixel structure that can be employed in a differential analog double correlated sampling (DADCS) architecture to at least partially compensate for kTC noise. Pixel structure 300 can be included in an array of many pixels to form an image sensor. For example, imaging sensor 370 is shown in FIG. 3 which includes pixel array 371 and pixel control circuitry 372. In FIG. 3, a top view is shown of pixel structure 300, which represents a single pixel structure area of imaging sensor 370. FIG. 3 also indicates a cross-section 'cut' along A-A' which is used in the side view illustrations in the figures below.

The pixels in pixel structure 300 are configured to sense incident light propagating to the pixel structure from the top and into the figure. This example is referred to as front side illumination (FSI). Other configurations are possible with the pixels configured to sense incident light propagating to the pixel structure from the bottom and out from the figure, referred to as back side illumination (BSI). Associated light filtering components are positioned between light sources and the pixel, namely on the 'top' side in FSI examples, and on the 'back' side in BSI examples. Not shown in for clarity FIG. 3 are various other structures and elements of an integrated ToF imaging sensor.

A semiconductor substrate is employed onto which various structures are formed using various lithography fabrication processes, such as etching, deposition, masking, diffusion, ion implantations, and the like. A semiconductor wafer is typically used as the substrate, which in this example is a p-type wafer labeled as 330 in FIG. 3. Although n-type wafers can be employed, the examples herein will focus on p-type wafers for clarity.

Pixel structure 300 comprises a differential pixel structure configured to sense light for time-of-flight techniques, or other applications. In one implementation of pixel structure 300, photo charges related to incident light are collected in differential polysilicon fingers 311 and 321. Polysilicon fingers 311 and 321 are arranged and operated in a differential manner, with a first 'A-side' structure 310 and a second 'B-side' structure 320. Although variations are possible, polysilicon fingers 311 and 321 can have shallow trench isolation (STI) barriers (319 and 329) formed between both, and have p-type doping established underneath. STI barriers can reduce unwanted charge transfer between polysilicon fingers 311 and 321 during integration periods as well as reduce charge transfer from elements of adjacent pixels of array 371.

Figure 4:
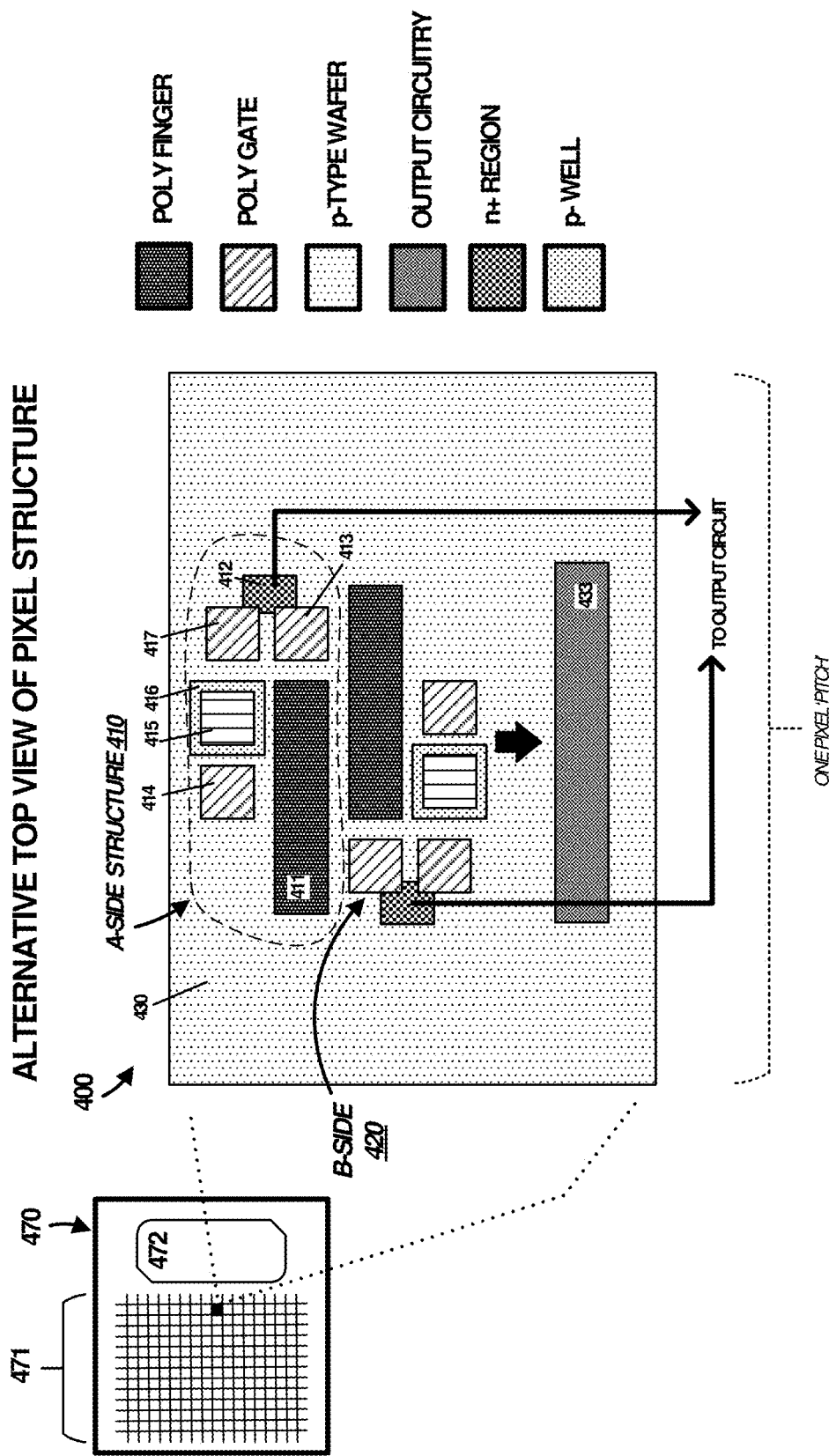
FIG. 4 illustrates a top view of a pixel structure in an implementation.

A-side 310 includes elements 311-319, and B-side 320 includes similar elements 321-329. Polysilicon fingers of the A-side of pixel array 371 are all modulated with a first clock, and polysilicon fingers of the B-side of pixel array 371 are all modulated with a second clock. Polysilicon fingers of the A-side and the B-side are typically oriented parallel or anti-parallel to each other on a semiconductor substrate. FIG. 3 shows a parallel orientation, and FIG. 4 shows an anti-parallel orientation of side A and side B. The examples in FIG. 3 will focus on A-side element operations and structures, but it should be understood that similar operations and structures can be employed for the B-side elements.

Figure 5:
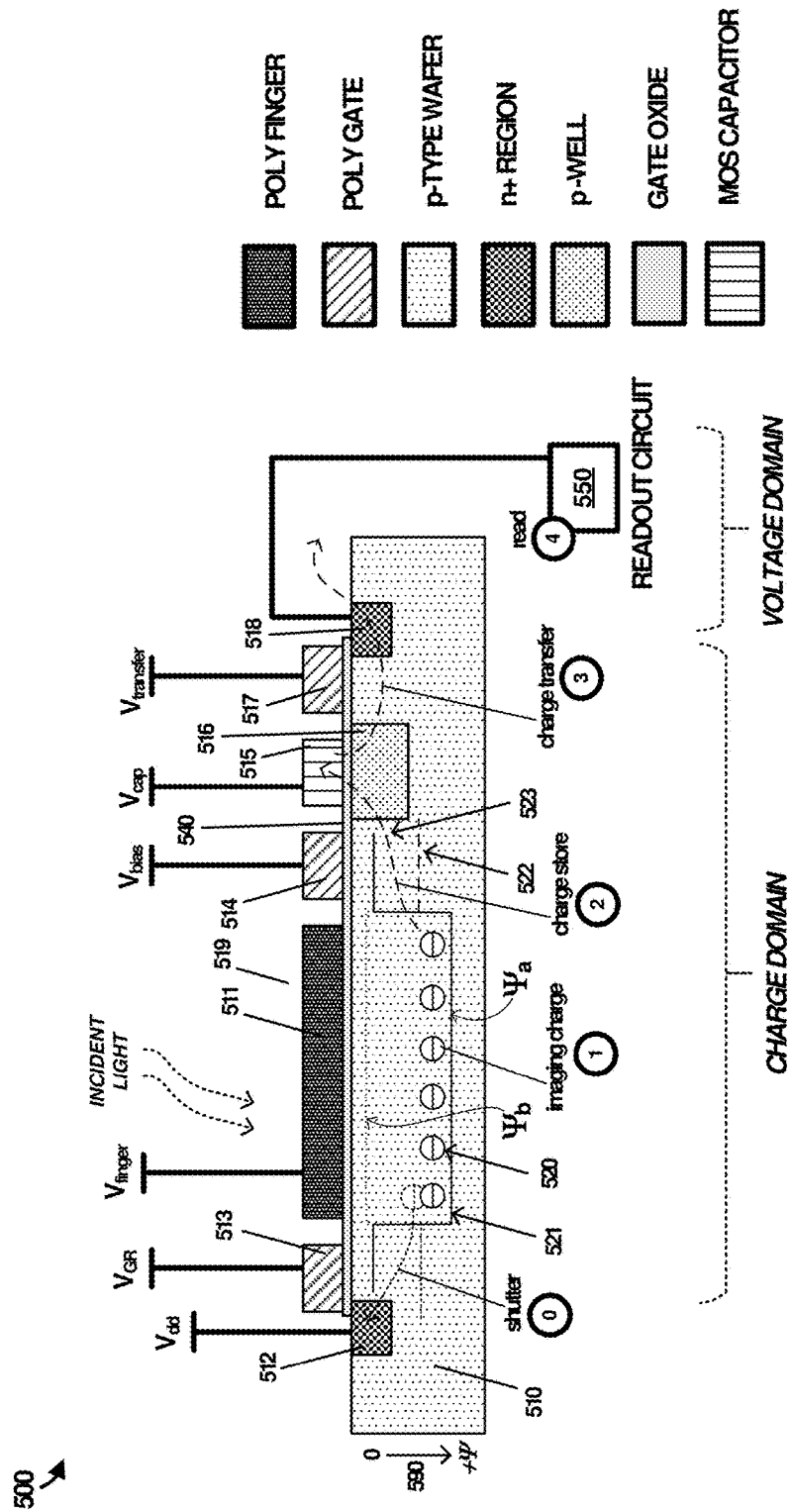
FIG. 5 illustrates a cross-sectional view of a pixel structure in an implementation.

Elements 311, 313, 314, 315, 317, 321, 323, 324, 325, and 327 each comprise structures with associated polysilicon (polycrystalline silicon) gates in this example. Elements 311, 313, 314, 315, 317, 321, 323, 324, 325, and 327 can comprise metal-oxide semiconductor (MOS) gates, where the 'metal' can be polysilicon or any suitable material. Associated gate oxide regions can be included underneath some or all of elements 311, 313, 314, 315, 317, 321, 323, 324, 325, and 327 of pixel structure 300, but are not shown in FIG. 3 for clarity. FIG. 5 shows example gate oxide layers. The gate oxides can be silicon dioxide or any suitable dielectric material. During manufacture of pixel structure 300, certain areas of the surface of substrate 330 are typically p-doped, thus hampering charges from being transferred between polysilicon elements. Preferably the polysilicon gaps must be established as small enough to be substantially protected by the oxide polysilicon spacers during p-implantation if the implantation is after polysilicon deposition in the area of the gaps. Variations are possible based on the lithography process or manufacturing techniques.

Individual pixels each comprise individual photodetectors. Some non-ToF imaging sensors use active pixel sensor (CMOS) style pixels, photo sensitive diodes, photo gate diodes, or pined photodiodes, among other photodetectors. However, pinned diodes and the like are not ideal for use in differential/ToF pixels. Instead, ToF pixels can employ special modulating polysilicon gate structures referred to as polysilicon fingers that are employed for collecting photocharges related to incident light. Furthermore, to make sufficient space on a semiconductor substrate for an array of these polysilicon fingers, charge handling structures and charge storing structures should be in a more compact configuration than afforded by pinned diodes. For a differential pixel as described in FIG. 3, two such photo charge collection areas kept in electrical isolation are employed. The charges are established by incident light and stored as minority carriers under the associated polysilicon gate whose charge capacity per unit area is much larger than a pinned diode. In the example of FIG. 3, a very lightly doped p-type substrate is employed, so the minority carriers are electrons (negative charge) and the majority carriers are holes (positive charge).

Turning now to operations and elements of A-side structure 310, charges from polysilicon finger 311 modulate between two voltages, such as predetermined high and low voltage levels. When an associated polysilicon finger 311 is driven to the high voltage level, charges are collected by the polysilicon finger 311 related to incident light, and when the polysilicon finger 311 is driven to the low voltage level, charge is transferred to a charge storage element to enable global shutter operation, such as charge storage element 315 shown in FIG. 3. However, charges once transferred to an associated charge storage element, such as charge storage element 315, should preferably not substantially return to polysilicon finger 311. To prevent substantial return of charge to polysilicon finger 311 and allow charge storage element 315 to capture more charges, bias gate 314 is employed.

Bias gate 314 isolates polysilicon finger 311 from charge storage element 315. When polysilicon finger 311 is at a predetermined $V_{low}$ some of the charges move to bias gate 314 from where the charges can be swept into charge storage element 315. Preferably bias gate 314 is relatively small so a majority of charges quickly find their way to charge storage element 315 and only a small fraction falls back into polysilicon finger 311 when polysilicon finger 311 goes back to a predetermined $V_{high}$. The introduction of bias gate 314 allows the capacitor to collect meaningful amounts of charge with voltages used in the ToF System. In a ToF system, charges are preferred to be established from incident light only by the polysilicon finger and not by the capacitance element which is driven to a relatively high voltage.

Charge storage element 315 can be formed from a MOS structure. This MOS structure might comprise a polysilicon or metallized gate structure. To further achieve this operation, charge storage element 315 can be placed in a "p-well" 316 that reduces charge entry from charges generated outside the p-well. Thus, the p-well helps isolate charge storage element 315 from the rest of the pixel elements. Preferably p-well 316 is a lightly doped retrograde p-well whose doping is adjusted for this purpose. The 'p' dopant can hinder unwanted transfer of charges into charge storage element 315. However, this hindrance can be overcome by a higher potential/bias applied to charge storage element 315 and appropriate bias applied to at least bias gate 314. Thus, p-well 316 receives charges via appropriate biasing of charge storage element 315 and selective activation of bias gate 314, which allows charge storage element 315 to receive charges from the associated polysilicon finger 311.

Moreover, the p-well can protect against ambient light collection due in part to the potential barrier established by the p-well with respect to the substrate. In further examples, a Shallow Trench Isolation (STI) barrier can be established between charge storage element 315 and associated polysilicon finger 311, where the STI barrier protects against charges inadvertently falling back into polysilicon finger 311 from charge storage element 315. The p-well underlying charge storage element 315 can comprise a p-type dopant well in semiconductor substrate 330, where the p-type dopant well comprises a higher p-type doping level than substrate 330. Other elements of pixel array 371 can be included in p-well structures, such as output circuitry 333, or gate structures 313-314, and 317. P-well 316 can start in the gap area between the poly/gate regions that form elements 314 and 317.

Global shutter operations in ToF pixels can be provided by the structures in FIG. 3. Specifically, charge storage element 315 provides for storage of integration charges received from polysilicon finger 311. All pixels of pixel array 371 can capture a scene at the same time, and associated photo charges are integrated and stored in associated charge storage elements until readout from the pixel. After the integration/capture process, charges in charge storage element 315 are ultimately digitized for use in ToF/imaging applications. However, before this digitization is performed, the charges accumulated by charge storage element 315 are first converted into a corresponding voltage, and then various corrections, correlations, or compensations can be performed on the resultant voltages. These compensations include reductions in readout voltage uncertainty (i.e. kTC noise) of the pixel arrangements.

To generate a voltage from the charge accumulated by charge storage element 315, diffusion node 318 is employed. A voltage change on diffusion node 318 is representative of the number of charges in charge storage element 315. An n-type dopant well (n+) in substrate 330 comprises diffusion node 318. However, the n+ region can also be placed in a p-well similar to well 316 to reduce parasitic photo charge collection by the n+ region. As noted previously, the charges under charge storage element 315 are minority carriers and thus a relatively complete charge transfer to diffusion node 318 can be performed without additional kTC noise.

Transfer gate 317 is employed to at least isolate polysilicon finger 311 and other elements from associated diffusion node 318 used for readout. Transfer gate 317 is employed to selectively transfer (i.e. dump) charge from charge storage element 315 to diffusion node 318. Transfer gate 317 is driven to 0V during the integration process to prevent charges being accumulated at charge storage element 315 from being collected by diffusion node 318. During readout of the voltage at diffusion node 318 by associated output circuitry 333, the voltage that drives transfer gate 317 is slightly raised above 0V to allow charge transfer to diffusion node 318.

To the left of polysilicon finger 311, an optional global reset (GR) gate 313 is included, along with a dedicated diffusion node 312 (n+). GR gate 313 is employed to selectively transfer charge accumulated by the associated finger 311 to a voltage source coupled to diffusion node 312. When activated by an associated voltage or potential change, GR gate 313 allow charge accumulated by the associated finger 311 to flow to diffusion node 312 and ultimately be drained to a voltage source. This charge is undesired charge accumulated between measurement phases of the pixel structure, such as from ambient light incident to polysilicon finger 311, and GR gate 313 is activated during associated reset phases to drain this undesired charge from polysilicon finger 311. In some examples, GR gate 313 is employed in a global reset or anti-blooming arrangement of pixel array 371 which clears or drains any latent charge from the associated pixels for a more accurate measurement phase. This global reset can serve an anti-blooming function since charges are drained from the pixels, and effects of blooming overflow due to ambient light are reduced.

FIG. 4 alternative pixel structure 400, as an alternative arrangement of elements of pixel structure 300 of FIG. 3. FIG. 4 also shows anti-parallel polysilicon fingers 411, a more compact arrangement in the "left-right" direction, but a less compact arrangement in the "up-down" direction. The elements of FIG. 4, such as imaging sensor 470, pixel array 471, and pixel control circuitry 472 operate similarly to FIG. 3.

FIG. 4 illustrates a top view semiconductor topology for pixel structure 400. Pixel structure 400 illustrates one pixel 'pitch' which includes one differential pixel structure configured to perform ToF operations. Pixel structure 400 comprises a pixel structure that can be employed in a DADCS architecture, which can be included in an array of many pixels to form an ToF image sensor. For example, imaging sensor 470 is shown in FIG. 4 which includes pixel array 471 and pixel control circuitry 472. In FIG. 4, a top view is shown of pixel structure 400, which represents a single pixel structure area of imaging sensor 470.

In FIG. 4, polysilicon fingers 411, bias gates 414, capacitance element 415, p-well 316 operate similarly to the counterparts found in FIG. 3. However, structure 400 includes a shared diffusion node 412 (n+). This shared diffusion node 312 is shared among transfer gate 417 and global reset gate 413 that are associated with the same polysilicon finger. Since the activations of gate 417 and 413 in this example are not typically simultaneous, then shared diffusion node 412 can be employed to save some space or real estate within the pixel for each 'side' of the pixel structure. Control circuitry 433 can operate gates 417 and 413 accordingly to share diffusion node 412.

The materials and geometries of elements of pixel structure 300 in FIG. 3 and pixel structure 400 in FIG. 4 can vary. Various semiconductor fabrication techniques and materials are employed for the pixel structures herein. Typically, the various elements of the pixel structures comprise epitaxial layers of silicon, which can be doped or ion implanted to form various regions. Polysilicon gates are employed and can be deposited by chemical vapor deposition or patterned with photolithography and etched, among other processes. Various oxides can be grown, using thermally grown techniques or other oxide formation processes.

As a further example of the operation of an enhanced pixel structure, such as those shown in FIGS. 3 and 4, a cross-sectional view of pixel structure 500 is included in FIG. 5. Pixel structure 500 comprises a pixel structure that can be employed in a differential analog double correlated sampling (DADCS) architecture, and can be included in an array of many pixels to form an image sensor. Pixel structure 500 can comprise a cross-sectional view A-A' from FIG. 3, although other examples are possible. For clarity, FIG. 5 focuses on one-half of the differential pixel structure found in FIGS. 3 and 4, with a single polysilicon finger configured to detect light. It should be understood that other pixel elements can be included and a differential arrangement can also be employed in conjunction with the elements of FIG. 5. Pixel structure 500 may be configured to sense incident light propagating to the pixel structure from the top of the figure. This example is referred to as front side illumination (FSI). Pixel structure 500 may also be configured to sense incident light propagating to the pixel structure from the bottom of the figure, referred to as back side illumination (BSI).

Semiconductor substrate 510 employed onto which various structures are formed using various lithography fabrication processes, such as etching, deposition, masking, diffusion, ion implantations, and the like. A semiconductor wafer is typically used as the substrate, which in this example is a p-type wafer labeled as 510 in FIG. 5. Although n-type wafers can be employed, the examples herein will focus on p-type wafers for clarity.

Elements 511, 513, 514, 515, and 517 each comprise transistors structures having associated polysilicon (polycrystalline silicon) gates in this example. Each gate has an associated control or activation voltage coupled thereto, such as via metal interconnect or other conductive pathways to voltage sources, control circuitry, readout circuit 550, or other circuit elements. Associated gate oxide layer 540 is included underneath some or all of elements 511, 513, 514, 515, and 517 of pixel structure 500. The gate oxide can be silicon dioxide or any suitable dielectric material. During manufacture of pixel structure 500, certain areas of the surface of substrate 530 are typically p-doped after polysilicon deposition, thus hampering charges from being transferred between polysilicon elements. Preferably the polysilicon gaps must be established as small enough to be substantially protected by the oxide polysilicon spacers during p-implantation if the implantation is performed after polysilicon deposition in the areas of the gaps.

Figure 6:
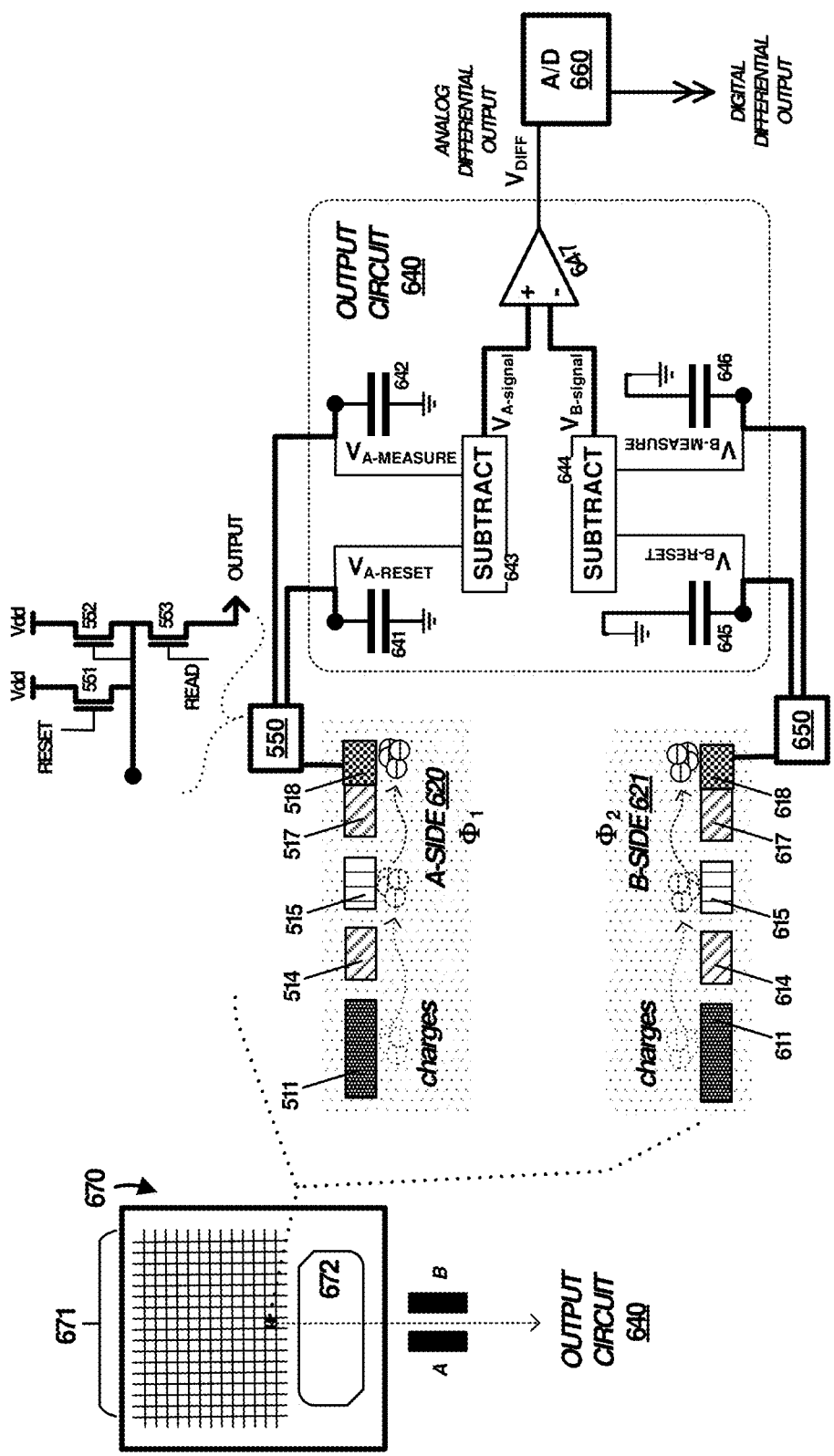
FIG. 6 illustrates examples for operating an imaging sensor in an implementation.

Charges 520 are established from incident light by polysilicon finger 511, and are collected underneath polysilicon finger 511. Operation '1' in FIG. 5 shows charge establishment below polysilicon finger 511. In the example of FIG. 5, a p-type substrate is employed, so the minority carriers are electrons (negative charge) and the majority carriers are holes (positive charge). Polysilicon finger 511 typically is operated differentially in conjunction with another polysilicon finger of another side of a pixel structure not shown in FIG. 5 for clarity. FIG. 6 shows this differential arrangement in operation. During a measurement phase, polysilicon finger 511 is modulated using $V_{finger}$ to establish two different potential levels, $\Psi_b$ and $\Psi_a$. The surface potential configuration underneath the polysilicon gates is shown in FIG. 5. The polarity of each potential well is indicated with potential gauge 590 which indicates relative potentials from 0 to $+\Psi$. It should be noted that the surface potential is denoted by $\Psi$ which is typically not equal to a voltage applied to a corresponding gate due to 'flat band' conditions found in typical MOS structures.

As mentioned above, polysilicon finger 511 is modulated between two voltages to create two predetermined potentials $\Psi_a$ and $\Psi_b$ under polysilicon finger 511. When $V_{finger}$ associated with polysilicon finger 511 is driven to $V_{high}$, potential $\Psi_a$ is established below polysilicon finger 511 and charges are collected by the polysilicon finger 511 related to incident light. When $V_{finger}$ associated with polysilicon finger 511 is driven to $V_{low}$, potential $\Psi_b$ is established below polysilicon finger 511 and the charges are transferred to a charge storage element, such as polysilicon capacitance element 515 shown in FIG. 5. Operation '2' in FIG. 5 shows charge storage by capacitance element 515, also referred to as an integration process.

However, charges once transferred to capacitance element 515, should preferably not substantially return to polysilicon finger 511. Specifically, if a voltage applied to capacitance element 515, $V_{Cap}$, C is a capacity of capacitance element 515, and Q is the collected charge at capacitance element 515, a voltage arrangement of $V_{high} < V_{Cap} + Q/C$ is desired. If $V_{high}$ and $V_{Cap}$ are both close to the same voltage, such as 3.3V, then only a relatively small amount of charge can be stored in capacitance element 515.

To prevent substantial return of charge to polysilicon finger 511 and allow capacitance element 515 to capture more charges, bias gate 514 is employed. Bias gates can be used in ToF pixel arrangements to isolate the polysilicon fingers from associated diffusion nodes used for readout. However, the bias voltages employed to properly operate in the example pixel structures herein may be on the order of a few hundred millivolts different. Thus, bias gate 514 can be biased at $V_{bias} = V_{low} + \varepsilon$ (where $\varepsilon$ may be about 100 mv) and $V_{Cap}$ is typically 3.3V, so that $V_{low} < V_{bias} < V_{Cap}$. When polysilicon finger 511 is at $V_{low}$ some of the charges move to bias gate 514 from where the charges can be swept into capacitance element 515. Preferably bias gate 514 is relatively small so a majority of charges quickly find their way to capacitance element 515 and only a small fraction fall back into polysilicon finger 511 when polysilicon finger 511 goes back to $V_{high}$.

The charge Q that is not collected into capacitance element 515 is $Q = (V_{Cap} - V_{bias} - \varepsilon) * C$. If bias gate 514 is driven to about 1V then advantageously a charge of $Q \approx 2.2V*C$ can be stored on the capacitor. Thus, the introduction of the bias gate allows the capacitor to collect meaningful amounts of charge with voltages used in the ToF System. In a ToF system charges are preferred to be established from incident light only by the polysilicon finger and not by the capacitance element which is driven to a relatively high voltage.

To further achieve this operation, capacitance element 515 can be placed in a "p-well" 516 that reduces charge entry from charges generated outside the p-well. Preferably p-well 516 is a lightly doped retrograde p-well whose doping is adjusted for this purpose. The 'p' dopant can hinder unwanted transfer of charges into capacitance element 515. However, this hindrance can be overcome by a higher potential/bias applied to capacitance element 515 and appropriate bias applied to at least bias gate 514. Thus, p-well 516 receives charges via appropriate biasing of capacitance element 515 and selective activation of bias gate 514, which allows capacitance element 515 to receive charges from the associated polysilicon finger 511. Microlens structures can also be employed to reduce the amount of incident light that reaches capacitance element 515.

Moreover, the p-well can protect against ambient light collection due in part to the potential barrier established by the p-well with respect to the substrate. In further examples, a Shallow Trench Isolation barrier can be established between capacitance element 515 and associated polysilicon finger 511, where the STI barrier protects against charges inadvertently falling back into polysilicon finger 511 from capacitance element 515, and vice versa. The p-well underlying capacitance element 515 can comprise a p-type dopant well in a semiconductor substrate, where the p-type dopant well comprises a higher p-type doping level than the substrate. Other elements of structure 500 can be included in p-well structures, such as output circuitry, or gate structures 513, 514, and 517. P-well 516 can start in the gap area between the poly/gate regions that form elements 514 and 517.

After an integration process, a voltage related to the charges under capacitance element 515 are read out by readout circuit 550 for use in imaging applications. A resultant voltage corresponding to the charge accumulated by capacitance element 515 is established by diffusion node 518. A voltage change on diffusion node 518 is representative of the number of charges in capacitance element 515. An n-type dopant region (n+) in substrate 530 comprises diffusion node 518. However, the n+ region can also be placed in a p-well similar to well 516 to reduce parasitic photo charge collection by the n+ region. As noted previously, the charges under capacitance element 515 are minority carriers and thus a relatively complete charge transfer to diffusion node 518 can be performed without any additional kTC noise.

Transfer gate 517 is employed to selectively transfer (i.e. dump) charge from capacitance element 515 to floating diffusion node 518. Operation '3' in FIG. 5 shows this charge transfer to floating diffusion node 518. Transfer gate 517 is driven to 0V by $V_{transfer}$ during the integration process to prevent charges being accumulated at capacitance element 515 from being collected by diffusion node 518. During readout of the voltage at diffusion node 518 by associated output circuitry 533, the voltage that drives transfer gate 517 ($V_{transfer}$) is slightly raised above 0V to allow charge transfer to diffusion node 518. Operation '4' of FIG. 5 illustrates the readout by readout circuit 550, which is further detailed in FIG. 6. Also voltage applied to capacitance element 515 can be released from 3.3V to a low value, such as 0V, during charge transfer to diffusion node 518.

To the left of each polysilicon finger 511, a global reset (GR) gate 513 is included, along with a dedicated diffusion node 512 (n+). GR gate 513 is employed to selectively transfer charge accumulated by the associated finger 511 to a voltage source coupled to diffusion node 512. When activated by an associated voltage or potential change ($V_{GR}$), GR gate 513 allows charge accumulated by the associated finger 511 to flow to diffusion node 512 and ultimately be drained to a voltage source ($V_{dd}$). This charge is undesired charge accumulated between measurement phases of the pixel structure, such as from ambient light incident to polysilicon finger 511, and GR gate 513 are activated during associated reset phases to drain this undesired charge from polysilicon finger 511. In some examples, GR gate 513 is employed in a global reset or anti-blooming arrangement of pixel array 571 which clears or drains any latent charge from the associated pixels for a more accurate measurement phase. Operation '0' illustrates operation of the global reset feature. In addition to activation of GR gate 513 in operation '0' or an associated reset phase, readout circuit 550 can reset diffusion node 518 to drain associated charge to a voltage source ($V_{dd}$). This reset circuitry is further shown in FIG. 6.

GR gate 513 can provide global reset capabilities to a pixel structures in a differential ToF system. This added GR gate 513 can provide an alternative discharge path for an associated polysilicon finger where charges are not dumped into a capacitance element as shown in FIG. 5 to achieve a better ambient light resilience. The alternative discharge path is shown as diffusion node 512 tied to $V_{dd}$. When activated, GR gate 513 diverts charges from being collected by the capacitor. To active the reset gate, $V_{finger}$ set to 1V, $V_{GR}$ is set to 1.1V, $V_{bias}$ and $V_{transfer}$ are both set to 0V. During the integration period, $V_{GR}$ is set to 0. In another arrangement of the pixel structure, as indicated in FIG. 4, diffusion nodes 512 and 518 can be shared because diffusion node 512 need only be floating during readout, and $V_{GR}$ is set to 0 during readout, so diffusion node 512 is not active during that time.

FIG. 6 comprises a system view of the operation of imaging sensor 670 with imaging array 671 and control logic 672. Elements of FIG. 6 related to operations included in FIG. 7. It should be noted that the elements of FIG. 6 are merely exemplary and that other functionally equivalent circuit configurations can be used. Operations of FIG. 7 will be identified below during the discussion of FIG. 6. Elements of FIG. 5 are included in FIG. 6 along with a differential pair to complement the elements of FIG. 5. In FIG. 6, two 'sides' of a differential pixel structure are shown, namely A-side 620 and B-side 621. As mentioned herein, the differential pixel structure can be employed to image ToF data for scenes presented to an imaging sensor, such as sensor 670. A-side 620 and B-side 621 are shown in a conceptual view, with only gate portions, diffusions nodes, and substrates shown along with associated charge transfer.

Before an integration and measurement phase, a reset process can be performed to drain out latent charges from various elements of the pixel structures. This reset process can be a part of a global reset function for a pixel array, where all of the pixels of array 671 are reset prior to measurement. Operation 710 indicates this reset or global reset which can drain latent charge from polysilicon fingers and from capacitance elements, among other portions of the pixel structure. Latent charge in polysilicon finger 511 can be drained by activation of GR gate 513. Reset gate 551 can bring diffusion node 518 to a source voltage potential for draining any accumulated charges from the diffusion node, and can also drain any latent charge held by associated capacitance element 515. The global reset can reduce blooming or other effects experienced by latent or intervening charge generated by ambient light or during non-measurement phases. The reset of the polysilicon fingers can also be referred to as an "anti-bloom" process that can reduce the effect of ambient light or non-measurement light captured by a polysilicon finger.

During differential operation of the integration period, each of A-side 620 and B-side 621 are operated differentially in complementary phases ($\Phi_1, \Phi_2$), so that photo-charges are generally established on one side while other photo-charges are transferred to a capacitance element on the other side, and this process cyclically repeats during a charge integration period of a measurement phase. Typically, incident light will be modulated due to modulation of a light source that emits light onto a scene. Demodulation of the charges generated by modulated light is performed by the differential arrangement and integration period.

As the polysilicon finger of one side is driven to $V_{high}$, the polysilicon finger of the other side is driven to $V_{low}$, and vice versa. Specifically, photo-induced charges are captured from the substrate under a polysilicon finger, and a majority (>80%) of these charges are collected under the polysilicon finger when the associated polysilicon finger is driven to $V_{high}$. These charges are transferred to associated capacitance elements 515 and 615 as minority carriers (i.e. n charges for a p-substrate) through the substrate by use of a biased polysilicon bias gate (514 and 614) when the associated polysilicon finger is driven to $V_{low}$. Capacitance elements 515 and 615 are typically biased at a 'high' voltage as discussed herein, while the charges are substantially blocked from leaving capacitance elements 515 and 615 and returning to the polysilicon fingers using associated bias gates 514 and 614. Charges are substantially blocked from returning to the polysilicon fingers when the polysilicon finger is driven to $V_{high}$ and by setting the $V_{bias}<V_{Cap}$. At the end of integration period, the quantity of charges collected by capacitance elements 515 and 615 are closely related to the quantity of charges collected by the associated polysilicon finger. In some examples, to hinder unwanted filling of charge into capacitance elements 515 and 615, and aid dumping of charge from capacitance elements 515 and 615, each capacitance element is placed in an associated p-well, as discussed herein.

Once the integration period is complete, a quantity of charges will be at the associated capacitance elements 515 and 615. These charges are held temporarily until a readout is performed. However, before a readout is performed, a diffusion node reset process occurs to establish a reset voltage of the diffusion node (operation 712). Reset gate 551 can momentarily bring diffusion node 518 (and similar circuitry for diffusion node 618) to a source voltage potential for draining any accumulated charges from the diffusion node. A reset voltage ($V_{reset}$) can be measured from each diffusion node (518 and 618) for use by circuitry of a column amplifier or output circuitry to compensate or correct measurement voltages (operations 711, 721). This $V_{reset}$ is stored in a capacitor for later use (operation 713). Each side of the differential pixel structure can have an associated $V_{reset}$ capacitor, which might reside in column amplifier circuitry, among other locations. In FIG. 6, capacitors 641 and 645 can store associated $V_{reset}$ values. For enhanced reduction in system noise (e.g. digital noise, etc. . . . ) readouts from the pixels can be performed differentially.

After $V_{reset}$ is stored, a readout of the charges stored under capacitance elements 515 and 615 can occur. During this readout phase, charges of capacitance elements 515 and 615 are first 'dumped' or transferred via transfer gates 517/617 to an associated diffusion node 518 and 618 for conversion into a voltage (operation 714) and ultimate readout by circuitry 550 and 650 as an associated measurement voltage, $V_{measure}$ (operation 715). Diffusion node 518 and 618 can be included in an associated lightly doped retrograde p-well. Capacitance elements 515 and 615 can transfer integrated charges to the associated diffusion node by way of an associated transfer gate 517 and 617. Transfer gates 517 and 617 can be activated during a readout phase to transfer the charges for readout on an associated diffusion node. This $V_{measure}$ can be stored in a capacitor for later use (operation 715). Each side of the differential pixel structure can have an associated $V_{measure}$ capacitor, which might reside in column amplifier circuitry, among other locations. In FIG. 6, capacitors 642 and 646 can store associated $V_{reset}$ values.

In many examples, capacitance elements 515 and 615 are emptied from charges before the integration period using global reset features discussed below. Also, the sizes or capacities of capacitance elements 515 and 615 and associated gate voltages for capacitance elements 515 and 615 are set such that with the applied voltages a maximum charge that can be stored in each capacitance elements 515 and 615 roughly corresponds to a maximum measurable voltage swing on the associated diffusion node with the charge transfer to the diffusion node. Once the charges of each of capacitance elements 515 and 615 are moved to an associated diffusion node, the charges become majority carriers and a voltage change of the associated diffusion node is indicative of the number of charges transferred from the capacitance element.

One example readout circuit is included in FIG. 6 as shown for circuit 550 of A-side 620. A similar circuit can be employed for B-side 621 in FIG. 6. A readout of the charges transferred to diffusion node 518 and 618 can be performed by readout gates 552-553. A source-follower configuration is employed which produces an output voltage for use in further circuitry. Both $V_{measure}$ and $V_{reset}$ values can be read out using readout gates 552-553. After $V_{measure}$ readout, any active illumination can be disabled to save power until a further measurement phase. Also, after $V_{measure}$ readout, a subsequent global reset process can occur.

Reset voltages ($V_{A-reset}$, $V_{B-reset}$) measured from the diffusion nodes during operation 713 and measurement voltages ($V_{A-measure}$, $V_{A-measure}$) measured from the diffusion nodes during operation 715 can be stored in output circuit 640 for use in compensation or correlation operations, among other operations. In some examples, output circuit 640 can comprise elements of a column amplifier circuit of elements 671 or 672, or output circuit 640 can be included in separate circuitry. This storage is in the analog domain, specifically stored on associated capacitance elements or capacitors. Capacitor 641 stores $V_{A-reset}$ for the A-side and capacitor 645 stores $V_{B-reset}$ for the B-side (operation 713). Capacitor 642 stores $V_{A-measure}$ for the A-side and capacitor 646 stores $V_{A-measure}$ for the B-side (operation 715).

Each 'side' then has a subtraction operation (643, 644) performed for the associated stored values, namely $V_{resets}$ are subtracted from $V_{measures}$ (operation 716) to remove kTC noise contained in the $V_{resets}$ from the $V_{measures}$, and produce a compensated result that at least partially reduces readout voltage uncertainty of the associated pixel arrangement. This readout uncertainty, or kTC noise, arises largely from capacitance associated with the corresponding diffusion node (n+). Other mathematical operations can be performed, but in this example subtraction via a differential operation is employed. The result for each subtraction operation is a $V_{signal}$ value for each side of the differential pixel, namely $V_{A-signal}$ and $V_{B-signal}$. The subtraction operation thus produces two 'correlated' sampled values ($V_{A-signal}$ and $V_{B-signal}$) that are employed in the differential analog double correlated sampling (DADCS) architecture. Each correlated value compensates for the $V_{reset}$ offset read from the associated diffusion node and is stored in capacitance in the analog domain.

$V_{A-signal}$ and $V_{B-signal}$ can be further individually stored in capacitors not shown in FIG. 6. Although separate capacitors are employed for each $V_{measure}$ and $V_{reset}$ of a side, further examples can employ only one capacitor per side. This shared capacitor can initially hold a $V_{reset}$ value, and then this value can be subtracted from a $V_{measure}$ value and subsequently stored into the capacitor as an associated $V_{signal}$ value. Thus, in some configurations, only capacitors 641 and 645 might be employed. In some examples, only differential values might be stored in the capacitor(s), thus reducing a quantity of capacitors.

Differential amplifier operation 647 is the employed for $V_{A-signal}$ and $V_{B-signal}$ to determine a difference or differential value $V_{diff}$ among $V_{A-signal}$ and $V_{B-signal}$ (operation 717). This differential output can then be used for further analysis, image composition, or other applications. Furthermore, an analog-to-digital (ADC or A/D) conversion step can be performed to transform the differential output from an analog representation into a digital representation. In this manner, only one A/D circuit 660 is needed to produce a differential pixel output, namely a DADCS output (operation 718). Differential amplifier 647 can apply a gain factor to the differential output, such as 10× or other gain factors. The differential output compensates for mismatches among the two sides, as well as other factors.

ToF pixels are generally differential with two outputs A and B. The signal of interest is most often the differential signal (A−B), as mentioned for $V_{diff}$ above. The differential signal is usually considerably smaller than the common mode signal (A+B)/2. Thus, the smaller (A−B) signal is often greatly amplified before ADC conversion. However, if $V_{reset}$ is the reset kTC cancellation sample and $V_{measure}$ is the value after integration then during (A−B) is obtained by (A−B)=($V_{A-measure}$−$V_{B-measure}$)−($V_{A-reset}$−$V_{B-reset}$) where ($V_{A-measure}$−$V_{B-measure}$) and ($V_{A-reset}$−$V_{B-reset}$) are digitized separately. Due to transistor and other component mismatch ($V_{A-reset}$−$V_{B-reset}$) may have a substantial offset. This offset is eventually cancelled when ($V_{A-reset}$−$V_{B-reset}$) is subtracted from ($V_{A-measure}$−$V_{B-measure}$). However, the offset eats into the dynamic range during each of the two separate ADC operations. To avoid this complex (and sometimes slow) process, special analog offset cancellation circuitry is typically applied. Furthermore, these two ADC operations might have been performed at different gain settings, and thus an accurate gain normalization step must be performed before the subtraction may be performed.

Advantageously the current examples, such as illustrated in FIG. 6, subtracts this offset in the analog domain before gain is applied by forming the final differential term to determine $V_{diff}$ as (($V_{A-measure}$−$V_{A-reset}$)−($V_{B-measure}$−$V_{B-reset}$)). A single ADC 660 is then applied with a single gain setting and all offsets are cancelled in the analog domain during the formation of ($V_{A-measure}$−$V_{A-reset}$) and ($V_{B-measure}$−$V_{B-reset}$). Thus, complex offset cancellation circuitry is not needed, and associated offsets are cancelled completely and gain normalization is not required.

Figure 7:
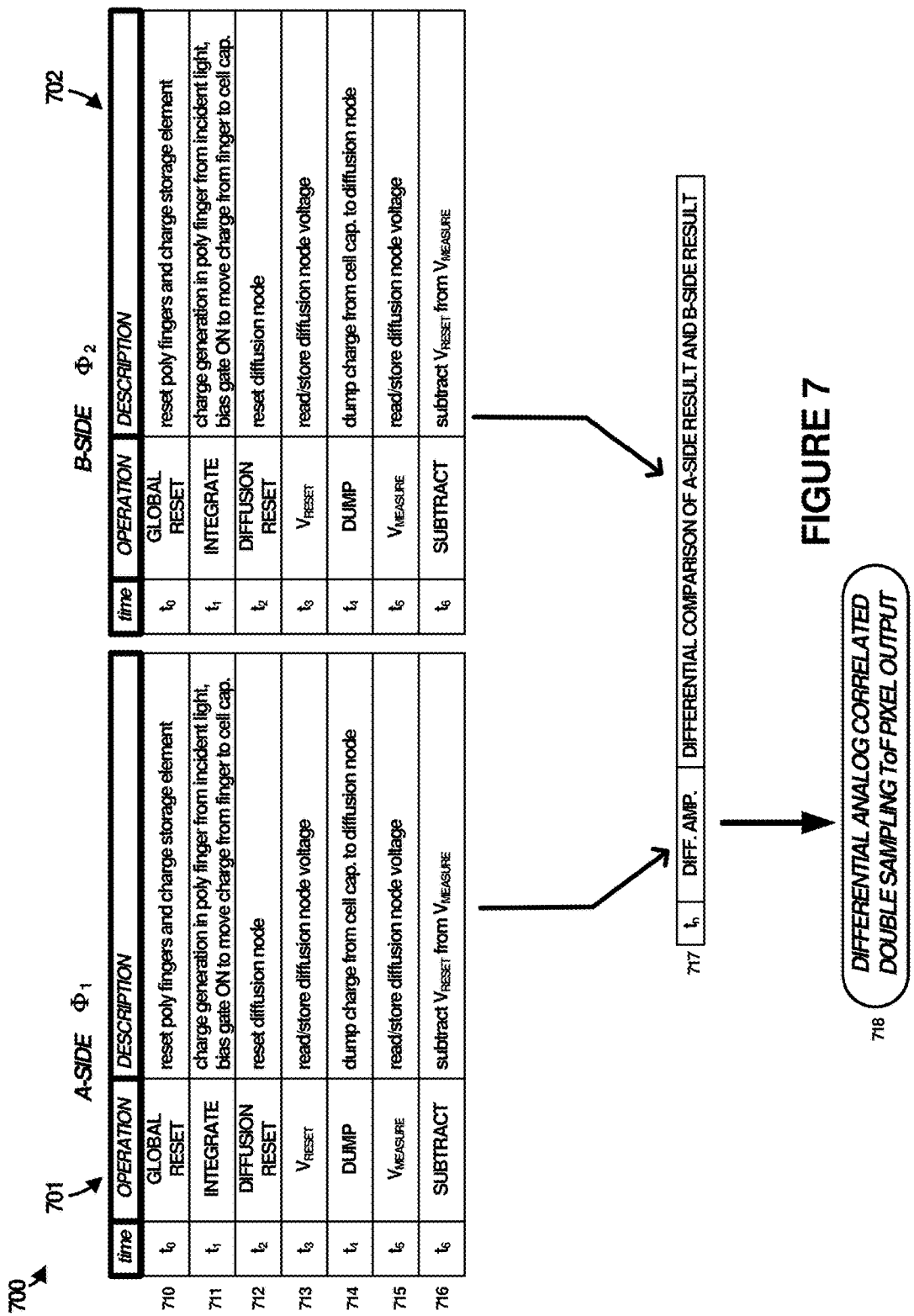
FIG. 7 illustrates steps for operating an imaging sensor in an implementation.

A summary of the operations of FIG. 6 and FIG. 7 can be as follows, with emphasis placed on side A of the differential structure for clarity (the other side can operate similarly). The operations include:

Operation 710—global reset/anti-blooming. Reset polysilicon finger and capacitance element (charge storage element). Keep any associated reset gates activated (i.e. $V_{GR}$ and reset gate 551 active) until an integration timeframe in the pixel structure. Example voltage biases include a voltage on bias gate 514 set to 0V, a voltage on transfer gate 517 set to 0V, a voltage $V_{GR}$ set to 1.1V, and polysilicon finger 511 is biased at a low voltage (e.g. 0V).

Operation 711—integration. Establish photo charges in substrate below polysilicon finger from incident light, bias gate enabled to move charge from polysilicon finger to capacitance element. $V_{GR}$ set and reset gate 551 deactivated, i.e. set to a predetermined logic low voltage (e.g. 0V). Capacitance element 515 is biased at a high voltage (e.g. 3.3V). Polysilicon finger 511 is modulated between $V_{high}$ and $V_{low}$.

Operation 712—diffusion node reset. Momentarily set diffusion node 518 to $V_{dd}$ using activation of gate 551, then release diffusion node 518 by allowing gate 551 to deactivate/open.

Operation 713—$V_{A\text{-}reset}$ measure. Sample voltage of diffusion node 518 into capacitor 641.

Operation 714—integration dump. Activate transfer gate 517 to dump charges in capacitance element 515 to diffusion node 518. Set transfer gate 517 to a predetermined voltage (e.g. $V_t\sim1$ V), set capacitance element 515 to voltage $\varepsilon V_t$ to dump accumulated charges stored under capacitance element 515.

Operation 715—$V_{A\text{-}measure}$. Sample voltage of diffusion node 518 into capacitor 642.

Operation 716—subtract. Determine $V_{A\text{-}signal}$ as ($V_{A\text{-}measure}-V_{A\text{-}reset}$), and optionally store in a capacitor.

Operation 717—differential amplifier. Determine $V_{diff}$ as (($V_{A\text{-}measure}-V_{A\text{-}reset}$) ($V_{B\text{-}measure}-V_{B\text{-}reset}$)); and (10) digitize $V_{diff}$.

Operation 718—differential analog double correlated sampling (DADCS) output, can subsequently digitize in ADC circuitry.

FIG. 8 illustrates controller 800 that is representative of any system or collection of systems in which the various time-of-flight detection, pixel control, pixel timing, and image processing operational architectures, scenarios, and processes disclosed herein may be implemented. For example, controller 800 can be employed in ToF processing circuitry 122 of FIG. 1, controller 212 of FIG. 2, pixel control circuitry 372 of FIG. 3, pixel control circuitry 472 of FIG. 4, or pixel control circuitry 672 of FIG. 6. Examples of controller 800 can be incorporated into further devices and systems, such as virtual reality devices, augmented reality devices, gaming consoles, camera devices, ToF cameras, smart phones, laptop computers, tablet computers, desktop computers, servers, cloud computing platforms, hybrid computers, virtual machines, smart televisions, smart watches and other wearable devices, as well as any variation or combination thereof.

Controller 800 may be implemented as a single apparatus, system, or device or may be implemented in a distributed manner as multiple apparatuses, systems, or devices. For example, controller 800 can comprise one or more application-specific integrated circuits (ASICs), field-programmable gate arrays (FPGA), or discrete logic and associated circuitry, including combinations thereof. Although not shown in FIG. 8, controller 800 can include communication interfaces, network interfaces, user interfaces, and other elements for communicating with a host system over communication link 820. Computing system 801 may optionally include additional devices, features, or functionality not discussed for purposes of brevity.

Controller 800 can also comprise one or more microcontrollers or microprocessors with software or firmware included on computer-readable storage media devices. If software or firmware is employed, the computer-readable storage media devices may include volatile and nonvolatile, removable and non-removable media implemented in any method or technology for storage of information, such as computer readable instructions, data structures, program modules, or other data. Examples of storage media include random access memory, read only memory, magnetic disks, optical disks, flash memory, virtual memory and non-virtual memory, magnetic cassettes, magnetic tape, magnetic disk storage or other magnetic storage devices, or any other suitable storage media. In no case is the computer readable storage media a propagated signal.

Controller 800 includes various controller portions to enhance time-of-flight sensing, namely emitter controller 810, pixel array controller 811, and optional image processor 812. Emitter controller 810 provides timing of emission of light to be synchronized with measurement of light by ToF pixels, and typically operates in conjunction with pixel array controller 811. In some examples, emitter controller 810 provides RF modulator control signaling to indicate an RF modulation frequency and phase to RF modulator circuitry and to pixel array controller 811. Pixel array controller 811 provides pixel control signaling to control the pixel structures discussed herein, whether the pixels are individual pixels or included in an array of pixels. Specifically, pixel array controller 811 provides for resetting ToF pixel areas for measurement of light, controlling transfer gates to transfer charge to shared diffusion nodes, and time multiplexing readout of ToF pixels, among other operations. Pixel array controller 811 provides for receiving pixel readout and providing pixel readout information to optional image processor 812. Image processor 812 provides for accumulating pixel data for an array of pixels to create 3D and 2D images and providing associated ToF information or 3D/2D image data to a host system over communication link 820. Image processor 812 also processes ToF information generated by pixels to form 3D digital images, such as depth map digital images, and form 2D digital images, such as ToF images, among other operations. When image processor 812 is omitted, pixel array controller 811 can provide pixel readout data to a host system over communication link 820. In some examples, pixel array controller 811 controls or includes an analog-to-digital conversion circuit to convert pixel readout signals to digital formats.

Certain inventive aspects may be appreciated from the foregoing disclosure, of which the following are various examples.

Example 1

A pixel arrangement in a time-of-flight sensor, comprising a polysilicon sensing element configured to establish charges related to incident light during a measurement phase, a charge storage element configured to accumulate integrated charges of the measurement phase transferred from the polysilicon sensing element, and a diffusion node configured to establish a measurement voltage representative of ones of the integrated charges established during the measurement phase that are dumped from the charge storage element. The pixel arrangement includes analog domain output circuitry comprising a measurement capacitance element that stores the measurement voltage, and a reset capacitance element that stores a reset voltage established at the diffusion node during a reset phase performed prior to the measurement phase. The analog domain output circuitry is configured to subtract the reset voltage stored in the reset capacitance element from the measurement voltage stored in the measurement capacitance element to establish a compensated result that at least partially reduces readout voltage uncertainty of the pixel arrangement, and provide the compensated result for processing into a pixel output voltage differentially derived with at least a further compensated result associated with a further polysilicon sensing element operated differentially to the polysilicon sensing element during an associated measurement phase.

Example 2

The pixel arrangement of Example 1, further comprising a bias gate element that establishes a bias potential between the polysilicon sensing element and the charge storage element to provide a pathway for transfer of at least a portion of the charges established at the polysilicon sensing element to the charge storage element and reduce a quantity of the charges transferred to the charge storage element from returning to the polysilicon sensing element, and a transfer gate element, based on activation, establishes a transfer potential between the charge storage element and the diffusion node to dump the ones of the integrated charges stored at the charge storage element to the diffusion node.

Example 3

The pixel arrangement of Examples 1-2, where the charge storage element comprises a polysilicon capacitor element formed with an underlying p-type dopant well of a higher p-type doping level than a semiconductor substrate associated with the pixel arrangement; and where the underlying p-type dopant well establishes a higher potential level than the bias potential of the bias gate element to provide the pathway for at least the portion of the charges established at the polysilicon sensing element to be transferred to the charge storage element from the polysilicon sensing element.

Example 4

The pixel arrangement of Examples 1-3, where the readout voltage uncertainty of the pixel arrangement comprises a kTC noise associated with a readout capacitance of the pixel arrangement.

Example 5

The pixel arrangement of Examples 1-4, further comprising a reset gate, based on activation during the reset phase, drains to a voltage source at least a portion of intervening charges established at the polysilicon sensing element.

Example 6

The pixel arrangement of Examples 1-5, where the analog domain output circuitry further comprises differential amplifier circuitry configured to derive the pixel output voltage as a differential voltage among the compensated result and the further compensated result.

Example 7

The pixel arrangement of Examples 1-6, where the analog domain output circuitry is further configured to provide the pixel output voltage to an analog-to-digital converter for conversion of the pixel output voltage as an analog pixel representation into a digital pixel representation.

Example 8

The pixel arrangement of Examples 1-7, where the digital pixel representation is processed along with at least further digital pixel representations of further pixel arrangements of the time-of-flight sensor to determine a time-of-flight measurement for a scene presented to the time-of-flight sensor.

Example 9

A time-of-flight (ToF) imaging sensor, comprising a semiconductor substrate, an array of differential pixel structures for sensing at least light that are each configured to produce associated reset voltages resultant from associated reset phases and associated measurement voltages resultant from associated measurement phases performed after to the associated reset phases, capacitance elements that store ones of the measurement voltages and ones of the reset voltages, and readout circuitry configured to establish compensated voltages for each of the differential pixel structures based at least on subtracting associated stored ones of the reset voltages from associated stored ones of the measurement voltages, and determine differential voltages among the compensated voltages that at least partially reduces readout voltage uncertainty for each of the differential pixel structures as pixel output voltages. Each of the differential pixel structures comprise at least two polysilicon sensing elements configured to establish charges related to incident light during corresponding ones of the measurement phases, charge storage elements each configured to accumulate integrated charges based at least on ones of the charges transferred from an associated polysilicon sensing element, and diffusion nodes each configured to produce the associated measurement voltages based at least on ones of the integrated charges dumped from an associated charge storage element, and produce the associated reset voltages established at the diffusion nodes.

Example 10

The ToF imaging sensor of Example 9, where each of the differential pixel structures further comprise bias gate elements each configured to establish a bias potential between the associated polysilicon sensing element and the associated charge storage element to provide a pathway for transfer of at least a portion of the charges established at the associated polysilicon sensing element to the associated charge storage element and reduce a quantity of the charges transferred to the associated charge storage element from returning to the associated polysilicon sensing element, and transfer gate elements, based on activation, are each configured to establish a transfer potential between the associated charge storage element and the associated diffusion node to dump the ones of the integrated charges stored at the associated charge storage element to the associated diffusion node.

Example 11

The ToF imaging sensor of Examples 9-10, where the charge storage elements each comprise a polysilicon capacitor element formed with an underlying p-type dopant well of a higher p-type doping level than the semiconductor substrate, and where the underlying p-type dopant well establishes a higher potential level than the bias potential of an associated bias gate element to provide the pathway for at least the portion of the charges established at the associated polysilicon sensing element to be transferred to the associated charge storage element from the associated polysilicon sensing element.

Example 12

The ToF imaging sensor of Examples 9-11, where the readout voltage uncertainty for each of the differential pixel structures comprises a kTC noise associated with a readout capacitance of the associated diffusion nodes.

Example 13

The ToF imaging sensor of Examples 9-12, where each of the differential pixel structures further comprise at least one reset gate, based on activation during the associated reset phases, drains to a voltage source at least a portion of intervening charges established at an associated polysilicon sensing element.

Example 14

The ToF imaging sensor of Examples 9-13, where the readout circuitry provides the pixel output voltages to analog-to-digital converter circuitry for conversion of the pixel output voltages as analog pixel representations into digital pixel representations, where the digital pixel representations are processed to determine a time-of-flight measurement for a scene presented to the ToF imaging sensor.

Example 15

A method of operating a time-of-flight (ToF) imaging pixel arrangement formed on a semiconductor substrate, the method comprising at least two polysilicon sensing elements each establishing charges related to incident light during corresponding differential measurement phases, charge storage elements each accumulating integrated charges transferred from an associated polysilicon sensing element, diffusion nodes each establishing measurement voltages based at least on ones of the integrated charges dumped from an associated charge storage element, first capacitance elements each storing reset voltages established at associated ones of the diffusion nodes prior to transfer of the ones of the integrated charges to the associated diffusion nodes, and second capacitance elements each storing the measurement voltages established at the associated ones of the diffusion nodes after transfer of the ones of the integrated charges to the associated diffusion nodes. The method includes analog output circuitry subtracting corresponding ones of the reset voltages stored in the first capacitance elements from ones of the measurement voltages stored in the second capacitance elements to establish compensated results that at least partially cancel readout voltage uncertainty of the pixel arrangement corresponding to each of the differential measurement phases, and determining differential voltages among the compensated results to establish pixel output voltages.

Example 16

The method of Example 15, further comprising bias gate elements each establishing a bias potential between an associated polysilicon sensing element and an associated charge storage element to provide a pathway for transfer of at least a portion of the charges established at the associated polysilicon sensing element to the associated charge storage element and reduce a quantity of the charges transferred to the associated charge storage element from returning to the associated polysilicon sensing element, and transfer gate elements each establishing a transfer potential between the associated charge storage element and the associated diffusion node to dump the ones of the integrated charges stored at the associated charge storage element to the associated diffusion node.

Example 17

The method of Examples 15-16, where the charge storage elements each comprise a polysilicon capacitor element formed with an underlying p-type dopant well of a higher p-type doping level than the semiconductor substrate, and where the underlying p-type dopant well establishes a higher potential level than the bias potential of an associated bias gate element to provide the pathway for at least the portion of the charges established at the associated polysilicon sensing element to be transferred to the associated charge storage element from the associated polysilicon sensing element.

Example 18

The method of Examples 15-17, where the readout voltage uncertainty of the pixel arrangement comprises a kTC noise associated with a readout capacitance of the associated ones of the diffusion nodes.

Example 19

The method of Examples 15-18, further comprising at least one reset gate draining to a voltage source at least a portion of intervening charges established at an associated polysilicon sensing element based on activation during an associated reset phase.

Example 20

The method of Examples 15-19, further comprising the analog output circuitry providing the pixel output voltages to analog-to-digital converter circuitry for conversion of the pixel output voltages as analog pixel representations into digital pixel representations, where the digital pixel representations are processed to determine a time-of-flight measurement for a scene presented to the ToF imaging sensor.

The terms "visible light" and "infrared light" (IR light) are discussed herein. Visible light typically comprises wavelengths of light that correspond to the visual range of a human eye, approximately wavelengths 390 nanometers (nm) to 700 nm. IR light comprises wavelengths of light that extend from approximately 700 nanometers to 1 millimeter (mm). Variations of wavelength ranges are possible, but in general visible light and IR light discussed herein refer to the above approximate ranges.

The functional block diagrams, operational scenarios and sequences, and flow diagrams provided in the Figures are representative of exemplary systems, environments, and methodologies for performing novel aspects of the disclosure. While, for purposes of simplicity of explanation, methods included herein may be in the form of a functional diagram, operational scenario or sequence, or flow diagram, and may be described as a series of acts, it is to be understood and appreciated that the methods are not limited by the order of acts, as some acts may, in accordance therewith, occur in a different order and/or concurrently with other acts from that shown and described herein. For example, those skilled in the art will understand and appreciate that a method could alternatively be represented as a series of interrelated states or events, such as in a state diagram. Moreover, not all acts illustrated in a methodology may be required for a novel implementation.

The descriptions and figures included herein depict specific implementations to teach those skilled in the art how to make and use the best option. For the purpose of teaching inventive principles, some conventional aspects have been simplified or omitted. Those skilled in the art will appreciate variations from these implementations that fall within the scope of the disclosure. Those skilled in the art will also appreciate that the features described above can be combined in various ways to form multiple implementations. As a result, the invention is not limited to the specific implementations described above, but only by the claims and their equivalents.

What is claimed is:

1. A pixel arrangement in a time-of-flight sensor, comprising:
   a polysilicon sensing element of a differential pixel structure configured to establish charges related to incident light during a measurement phase;
   a charge storage element configured to accumulate integrated charges of the measurement phase transferred from the polysilicon sensing element;
   a diffusion node configured to establish a measurement voltage representative of ones of the integrated charges established during the measurement phase that are dumped from the charge storage element; and
   analog domain output circuitry comprising a measurement capacitance element that stores the measurement voltage, and a reset capacitance element that stores a reset voltage established at the diffusion node during a reset phase performed prior to the measurement phase;
   the analog domain output circuitry configured to subtract the reset voltage stored in the reset capacitance element from the measurement voltage stored in the measurement capacitance element to establish a compensated result that at least partially reduces readout voltage uncertainty of the pixel arrangement, and provide the compensated result for processing into a pixel output voltage differentially derived with at least a further compensated result associated with a further polysilicon sensing element of the differential pixel structure during an associated measurement phase.

2. The pixel arrangement of claim 1, further comprising:
   a bias gate element that establishes a bias potential between the polysilicon sensing element and the charge storage element to provide a pathway for transfer of at least a portion of the charges established at the polysilicon sensing element to the charge storage element and reduce a quantity of the charges transferred to the charge storage element from returning to the polysilicon sensing element; and
   a transfer gate element, based on activation, establishes a transfer potential between at least the charge storage element and the diffusion node to dump the ones of the integrated charges stored at the charge storage element to the diffusion node.

3. The pixel arrangement of claim 2, wherein the charge storage element comprises a polysilicon capacitor element formed with an underlying p-type dopant well of a higher p-type doping level than a semiconductor substrate associated with the pixel arrangement; and
   wherein a bias on the charge storage element establishes a higher potential level than the bias potential of the bias gate element to provide the pathway for at least the portion of the charges established at the polysilicon sensing element to be transferred to the charge storage element from the polysilicon sensing element.

4. The pixel arrangement of claim 1, wherein the readout voltage uncertainty of the pixel arrangement comprises a kTC noise associated with a readout capacitance of the pixel arrangement.

5. The pixel arrangement of claim 1, further comprising:
   a reset gate, based on activation during the reset phase, drains to a voltage source at least a portion of intervening charges established at the polysilicon sensing element to provide an anti-blooming function to the pixel arrangement.

6. The pixel arrangement of claim 1, wherein the analog domain output circuitry further comprises:
   differential amplifier circuitry configured to derive the pixel output voltage as a differential voltage among the compensated result and the further compensated result.

7. The pixel arrangement of claim 1, wherein the analog domain output circuitry is further configured to provide the pixel output voltage to an analog-to-digital converter for conversion of the pixel output voltage as an analog pixel representation into a digital pixel representation.

8. The pixel arrangement of claim 7, wherein the digital pixel representation is processed along with at least further digital pixel representations of further pixel arrangements of the time-of-flight sensor to determine a time-of-flight measurement for a scene presented to the time-of-flight sensor.

9. A time-of-flight (ToF) imaging sensor, comprising:
   a semiconductor substrate;
   an array of differential pixel structures for sensing at least incident light that are each configured to produce associated reset voltages resultant from associated reset phases and associated measurement voltages resultant from associated measurement phases performed after the associated reset phases;
   capacitance elements that store ones of the measurement voltages and ones of the reset voltages; and
   readout circuitry configured to establish compensated voltages that at least partially reduces readout voltage uncertainty for each of the differential pixel structures based at least on subtracting associated stored ones of the reset voltages from associated stored ones of the measurement voltages, and determine differential voltages among the compensated voltages for each of the differential pixel structures as pixel output voltages;
   wherein each of the differential pixel structures comprise:
   at least two polysilicon sensing elements configured to establish charges related to incident light during corresponding ones of the measurement phases;

charge storage elements each configured to accumulate integrated charges based at least on ones of the charges transferred from an associated polysilicon sensing element;

diffusion nodes each configured to produce the associated measurement voltages based at least on ones of the integrated charges dumped from an associated charge storage element, and produce the associated reset voltages established at the diffusion nodes.

10. The ToF imaging sensor of claim 9, wherein each of the differential pixel structures further comprise:

bias gate elements each configured to establish a bias potential between the associated polysilicon sensing element and the associated charge storage element to provide a pathway for transfer of at least a portion of the charges established at the associated polysilicon sensing element to the associated charge storage element and reduce a quantity of the charges transferred to the associated charge storage element from returning to the associated polysilicon sensing element; and transfer gate elements, based on activation, are each configured to establish a transfer potential between the associated charge storage element and the associated diffusion node to dump the ones of the integrated charges stored at the associated charge storage element to the associated diffusion node.

11. The ToF imaging sensor of claim 10, wherein the charge storage elements each comprise a polysilicon capacitor element formed with an underlying p-type dopant well of a higher p-type doping level than the semiconductor substrate; and wherein biases on the charge storage elements establish a higher potential level than the bias potential of an associated bias gate element to provide the pathway for at least the portion of the charges established at the associated polysilicon sensing element to be transferred to the associated charge storage element from the associated polysilicon sensing element.

12. The ToF imaging sensor of claim 9, wherein the readout voltage uncertainty for each of the differential pixel structures comprises a kTC noise associated with a readout capacitance of the associated diffusion nodes.

13. The ToF imaging sensor of claim 9, wherein each of the differential pixel structures further comprise:

at least one gate, based on activation during the associated reset phases, drains to a voltage source at least a portion of intervening charges established at an associated polysilicon sensing element to provide an anti-blooming feature.

14. The ToF imaging sensor of claim 9, wherein the readout circuitry provides the pixel output voltages to analog-to-digital converter circuitry for conversion of the pixel output voltages as analog pixel representations into digital pixel representations, wherein the digital pixel representations are processed to determine a time-of-flight measurement for a scene presented to the ToF imaging sensor.

15. A method of operating a time-of-flight (ToF) imaging pixel arrangement formed on a semiconductor substrate, the method comprising:

at least two polysilicon sensing elements of a differential pixel structure each establishing charges related to incident light during corresponding differential measurement phases;

charge storage elements each accumulating integrated charges transferred from an associated polysilicon sensing element;

diffusion nodes each establishing measurement voltages based at least on ones of the integrated charges dumped from an associated charge storage element;

first capacitance elements each storing reset voltages established at associated ones of the diffusion nodes prior to transfer of the ones of the integrated charges to the associated ones of the diffusion nodes;

second capacitance elements each storing the measurement voltages established at the associated ones of the diffusion nodes after transfer of the ones of the integrated charges to the associated ones of the diffusion nodes;

analog output circuitry subtracting corresponding ones of the reset voltages stored in the first capacitance elements from ones of the measurement voltages stored in the second capacitance elements to establish compensated results that at least partially cancel readout voltage uncertainty of the pixel arrangement corresponding to each of the differential measurement phases; and the analog output circuitry determining differential voltages among the compensated results to establish pixel output voltages.

16. The method of claim 15, further comprising:

bias gate elements each establishing a bias potential between an associated polysilicon sensing element and an associated charge storage element to provide a pathway for transfer of at least a portion of the charges established at the associated polysilicon sensing element to the associated charge storage element and reduce a quantity of the charges transferred to the associated charge storage element from returning to the associated polysilicon sensing element; and transfer gate elements each establishing a transfer potential between the associated charge storage element and the associated diffusion node to dump the ones of the integrated charges stored at the associated charge storage element to the associated diffusion node.

17. The method of claim 16, wherein the charge storage elements each comprise a polysilicon capacitor element formed with an underlying p-type dopant well of a higher p-type doping level than the semiconductor substrate; and wherein biases on the charge storage elements establish a higher potential level than the bias potential of an associated bias gate element to provide the pathway for at least the portion of the charges established at the associated polysilicon sensing element to be transferred to the associated charge storage element from the associated polysilicon sensing element.

18. The method of claim 15, wherein the readout voltage uncertainty of the pixel arrangement comprises a kTC noise associated with a readout capacitance of the associated ones of the diffusion nodes.

19. The method of claim 15, further comprising:

at least one reset gate draining to a voltage source at least a portion of intervening charges established at an associated polysilicon sensing element based on activation during an associated reset phase to provide an anti-blooming feature to the pixel arrangement.

20. The method of claim 15, further comprising:

the analog output circuitry providing the pixel output voltages to analog-to-digital converter circuitry for conversion of the pixel output voltages as analog pixel representations into digital pixel representations, wherein the digital pixel representations are processed to determine a time-of-flight measurement for a scene presented to the ToF imaging sensor.

* * * * *